United States Patent
Imazawa et al.

(10) Patent No.: US 10,103,276 B2
(45) Date of Patent: Oct. 16, 2018

(54) THIN FILM TRANSISTOR SUBSTRATE

(71) Applicant: Mitsubishi Electric Corporation, Tokyo (JP)

(72) Inventors: Takashi Imazawa, Tokyo (JP); Toshiaki Fujino, Tokyo (JP); Tsukasa Motoya, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/750,994

(22) PCT Filed: Apr. 19, 2016

(86) PCT No.: PCT/JP2016/062298
§ 371 (c)(1),
(2) Date: Feb. 7, 2018

(87) PCT Pub. No.: WO2017/073097
PCT Pub. Date: May 4, 2017

(65) Prior Publication Data
US 2018/0233594 A1 Aug. 16, 2018

(30) Foreign Application Priority Data
Oct. 29, 2015 (JP) ................................. 2015-212476

(51) Int. Cl.
H01L 29/786 (2006.01)
G02F 1/1333 (2006.01)
(Continued)

(52) U.S. Cl.
CPC ........ *H01L 29/7869* (2013.01); *G02F 1/1368* (2013.01); *G02F 1/133345* (2013.01);
(Continued)

(58) Field of Classification Search
None
See application file for complete search history.

(56) References Cited

U.S. PATENT DOCUMENTS

| 6,016,174 A | 1/2000 | Endo et al. |
| 8,420,553 B2 | 4/2013 | Yamazaki |

(Continued)

FOREIGN PATENT DOCUMENTS

| JP | 2000-269505 A | 9/2000 |
| JP | 3208658 B2 | 9/2001 |

(Continued)

OTHER PUBLICATIONS

International Preliminary Report on Patentability and Written Opinion dated May 11, 2018 in PCT/JP2016/062298 filed Apr. 19, 2016.
(Continued)

*Primary Examiner* — Lex Malsawma
(74) *Attorney, Agent, or Firm* — Oblon, McClelland, Maier & Neustadt, L.L.P.

(57) ABSTRACT

A thin film transistor substrate includes: a plurality of pixels arranged in a matrix, each of the pixels including: a thin film transistor including: a gate electrode made of a metal and disposed on the substrate; a gate insulating film covering at least the gate electrode; a semiconductor layer including an oxide semiconductor provided at a position facing the gate electrode with the gate insulating film interposed therebetween; a source electrode and a drain electrode in contact with the semiconductor layer; and an interlayer insulating film provided on at least the semiconductor layer, the source electrode, and the drain electrode; and a pixel electrode electrically connected to the drain electrode. The gate electrode has hydrogen occlusion capability of $2.5 \times 10^{20}$ to $2 \times 10^{22}$ atoms/cm$^3$, and the semiconductor layer has a hydrogen concentration of $1 \times 10^{16}$ atoms/cm$^3$ or less.

10 Claims, 31 Drawing Sheets

(51) Int. Cl.
*H01L 27/12* (2006.01)
*G02F 1/1368* (2006.01)

(52) U.S. Cl.
CPC ........ *H01L 27/124* (2013.01); *H01L 27/1225* (2013.01); *G02F 2201/123* (2013.01)

(56) References Cited

U.S. PATENT DOCUMENTS

| | | | |
|---|---|---|---|
| 2007/0096098 A1 | 5/2007 | Ishiga et al. | |
| 2008/0128689 A1* | 6/2008 | Lee | H01L 29/7869 257/43 |
| 2009/0189153 A1 | 7/2009 | Iwasaki et al. | |
| 2010/0032665 A1* | 2/2010 | Yamazaki | H01L 29/78618 257/43 |
| 2010/0059804 A1 | 3/2010 | Hayashi et al. | |
| 2011/0006302 A1 | 1/2011 | Yamazaki et al. | |
| 2011/0057188 A1 | 3/2011 | Yamazaki et al. | |
| 2011/0079777 A1 | 4/2011 | Akimoto | |
| 2011/0084272 A1 | 4/2011 | Miyanaga et al. | |
| 2011/0127579 A1* | 6/2011 | Yamazaki | H01L 21/02472 257/192 |
| 2011/0193081 A1 | 8/2011 | Godo et al. | |
| 2012/0152728 A1* | 6/2012 | Yamazaki | C04B 35/453 204/192.25 |
| 2013/0009147 A1* | 1/2013 | Koyama | H01L 21/02422 257/43 |
| 2013/0043590 A1* | 2/2013 | Lin | H01L 21/76802 257/741 |
| 2013/0187153 A1 | 7/2013 | Yamazaki et al. | |
| 2014/0284597 A1* | 9/2014 | Shimomura | H01L 29/7869 257/43 |
| 2015/0048361 A1 | 2/2015 | Yamakita et al. | |

FOREIGN PATENT DOCUMENTS

| | | |
|---|---|---|
| JP | 2007-123672 A | 5/2007 |
| JP | 2010-67762 A | 3/2010 |
| JP | 4483235 B2 | 6/2010 |
| JP | 2011-35388 A | 2/2011 |
| JP | 2011-77515 A | 4/2011 |
| JP | 2011-97032 A | 5/2011 |
| JP | 2011-100982 A | 5/2011 |
| JP | 2011-181917 A | 9/2011 |
| JP | 5006598 B2 | 8/2012 |
| JP | 2012-248883 A | 12/2012 |
| JP | 5100906 B2 | 12/2012 |
| JP | 2013-175713 A | 9/2013 |
| JP | 2014-116372 A | 6/2014 |
| JP | 2014-229638 A | 12/2014 |
| JP | 2015-36797 A | 2/2015 |

OTHER PUBLICATIONS

International Search Report dated Jul. 12, 2016 in PCT/JP2016/062298 filed Apr. 19, 2016.

* cited by examiner

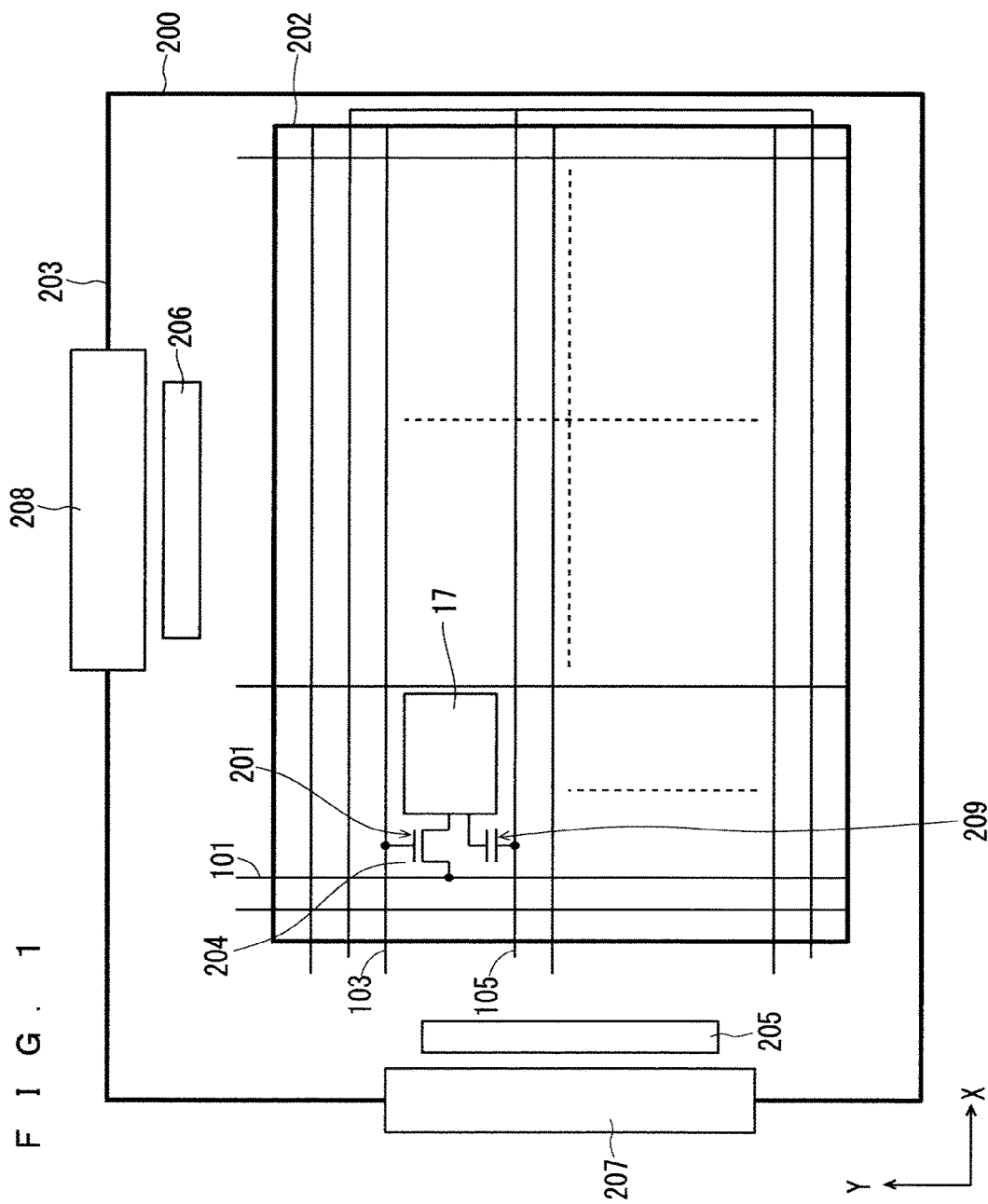

F I G. 1 1
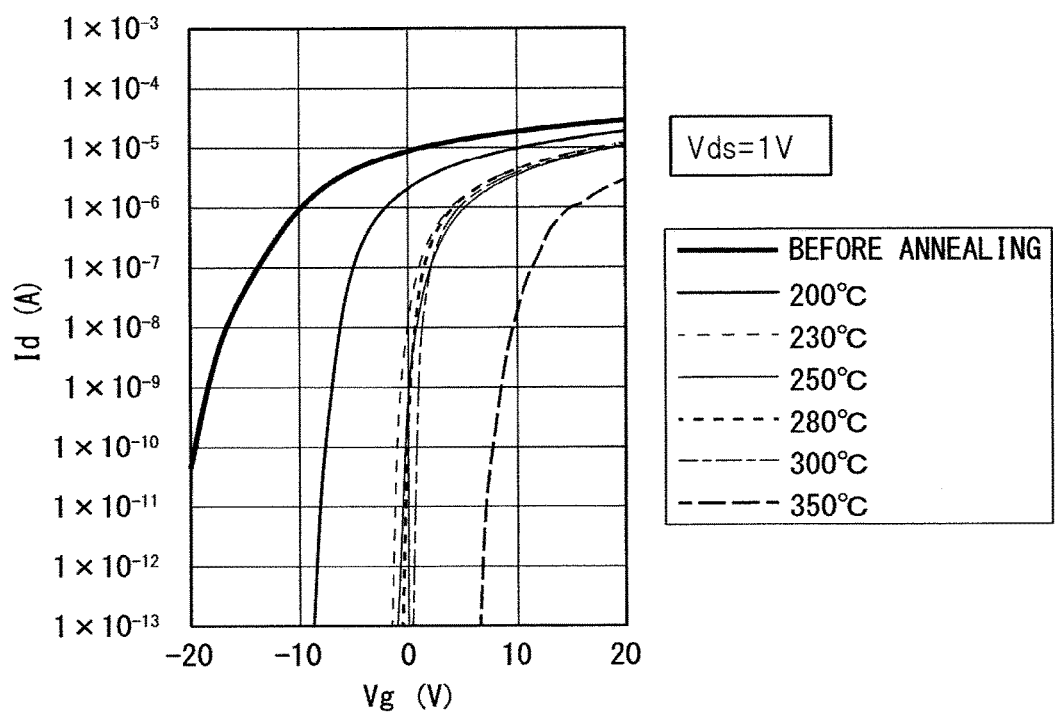

F I G. 1 2
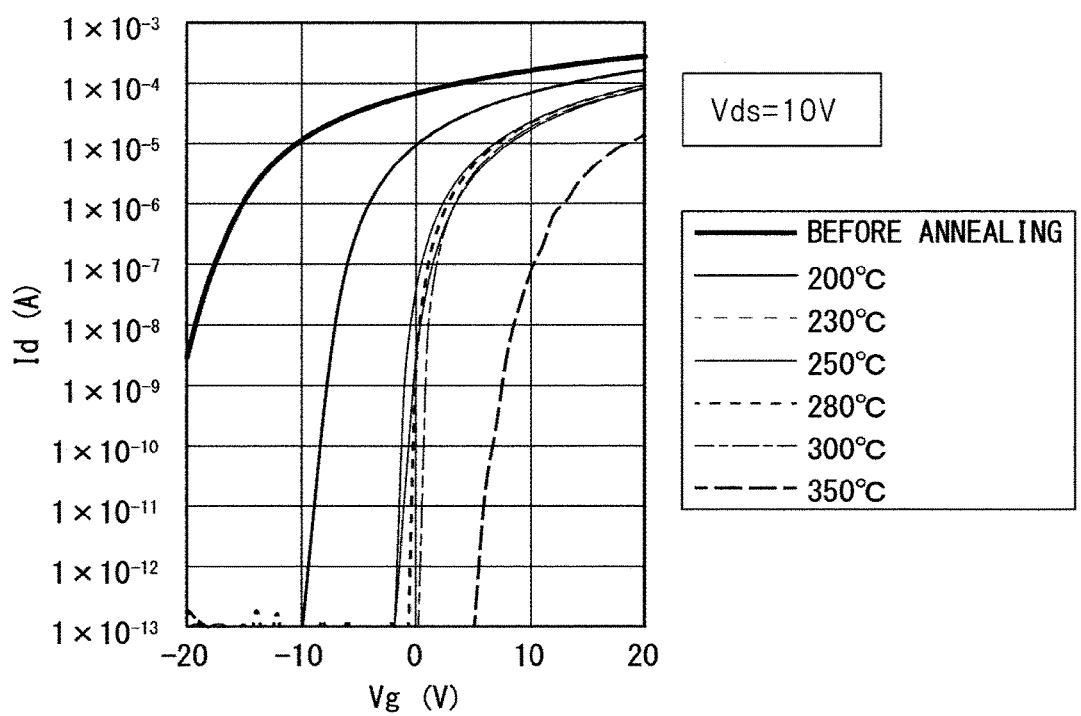

F I G. 1 4
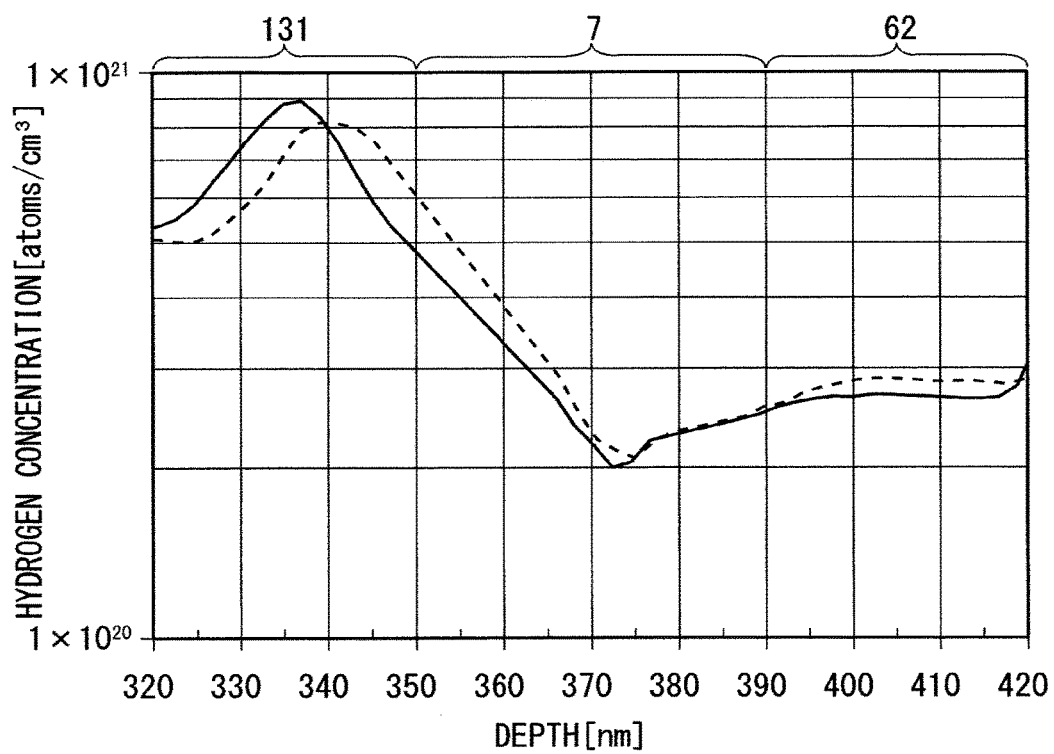

F I G. 1 5
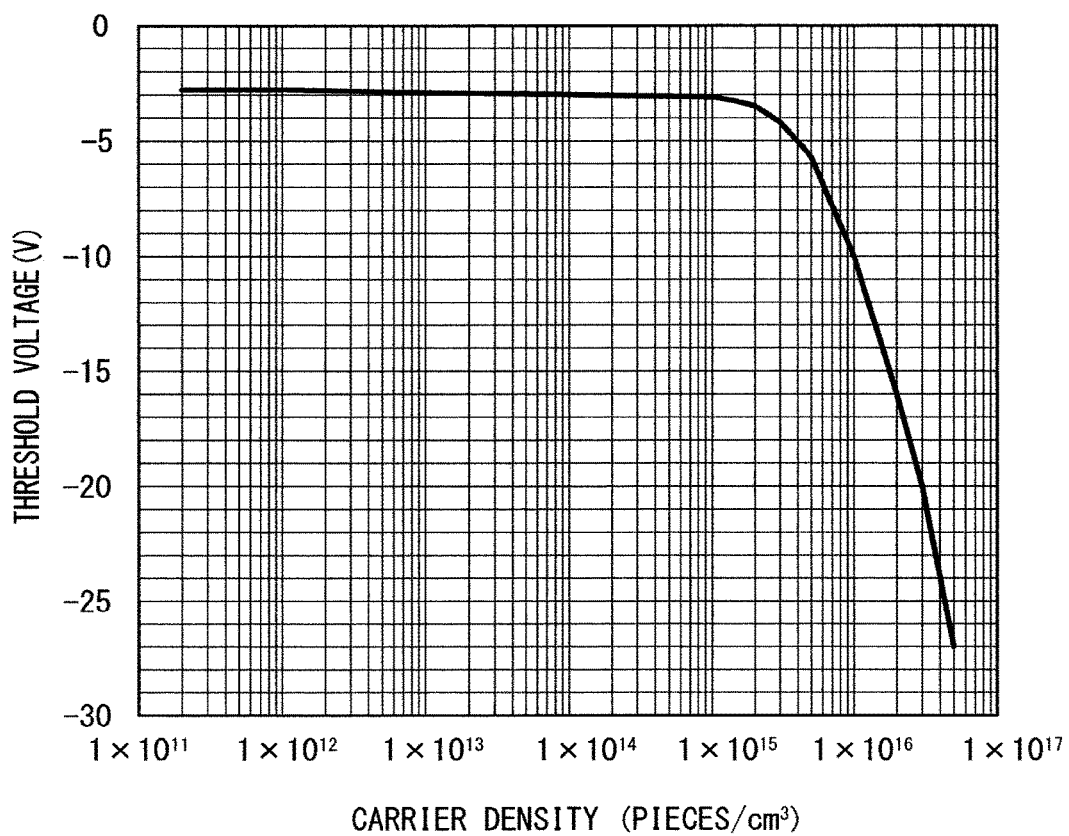

F I G. 2 1
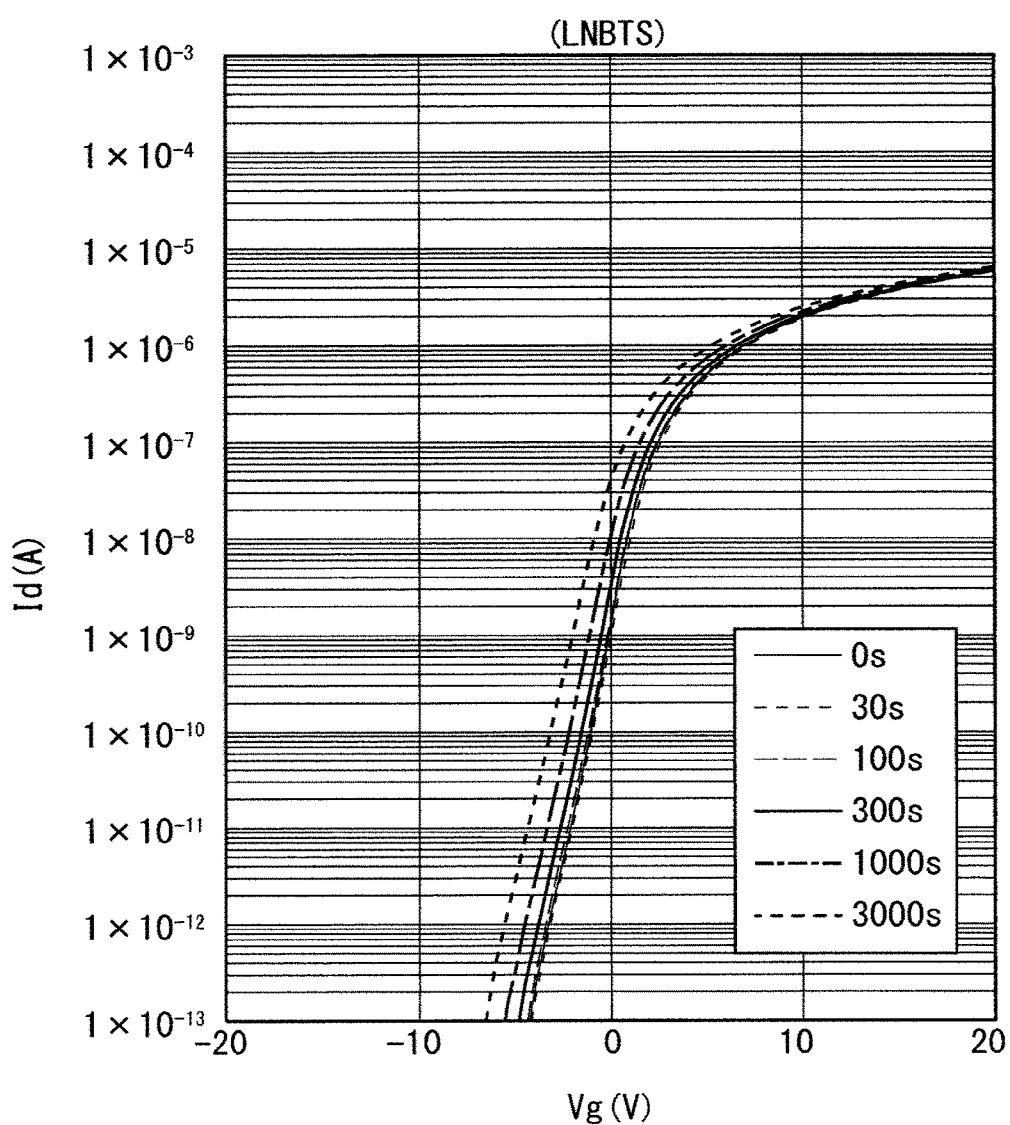

THIN FILM TRANSISTOR SUBSTRATE

TECHNICAL FIELD

The present invention relates to a thin film transistor substrate used for a liquid crystal display device and the like.

BACKGROUND ART

An electro-optic device such as a liquid crystal display (Liquid Crystal Display: hereinafter referred to as "LCD") includes a thin film transistor substrate (hereinafter referred to as "TFT substrate") using a thin film transistor (Thin Film Transistor: hereinafter referred to as "TFT") as a switching device.

A semiconductor device such as a TFT has a characteristic of low power consumption and a thin profile. Therefore, by utilizing such a characteristic of the semiconductor device, application to a flat panel display has been made, replacing a CRT (Cathode Ray Tube).

In an LCD which is one example of a flat panel display, generally, a liquid crystal layer is provided between a TFT substrate and a counter substrate. On the TFT substrate, TFTs are arranged, for example, in a matrix. Polarizing plates are provided outside such a TFT substrate and a counter substrate. Note that in transmissive and semi-transmissive LCDs, a back light unit is provided outside the TFT substrate or a counter substrate. Meanwhile, in a color display LCD, for example, a color filter of one color or two or more colors is provided on the counter substrate.

Typical structure of a TFT substrate for an LCD is disclosed, for example, in FIG. 1 of Patent Document 1. The TFT substrate has bottom-gate back-channel type TFTs, and pixel electrodes electrically connected to the TFTs are formed on a top layer. This structure can be manufactured using five photolithography processes.

Conventionally, in a switching device of a TFT substrate for a liquid crystal display device, amorphous silicon (Si) is generally used as a semiconductor active layer (channel layer). Furthermore, in recent years, development of a TFT using an oxide semiconductor for an active layer has been carried out actively. Since an oxide semiconductor has mobility higher than mobility of amorphous silicon, the oxide semiconductor has an advantage of implementing a small and high-performance TFT.

As an oxide semiconductor, a zinc oxide (ZnO)-based material and a material in which gallium oxide ($Ga_2O_3$), indium oxide ($In_2O_3$), oxidized tin ($SnO_2$), or the like are added to zinc oxide are mainly used. This technology is disclosed, for example, in Patent Documents 2 and 3.

In a TFT using an oxide semiconductor for a channel layer, in a case where hydrogen in the channel layer is present between lattices, the hydrogen will produce disorder of structure and reduce TFT characteristics such as mobility. Also, it is said that hydrogen in the channel layer serves as an electron donor, and in that case, carrier density that contributes to characteristics will rise. Meanwhile, in a case where hydrogen terminates uncombined bonds, carrier density will decrease. In addition, in a case where hydrogen diffuses from other layers into the channel layer when a TFT operates, one of above phenomena will occur and characteristics will vary. Thus, hydrogen in the channel layer affects initial characteristics and reliability of a TFT.

Meanwhile, for example, in Patent Document 4, a technology of improving TFT characteristics by controlling discharge and diffusion of hydrogen and oxygen through a total of three times of heat treatments in a manufacturing process is disclosed. This is to increase an on-state current and mobility by eliminating excessive hydrogen in the channel layer through first heat treatment after forming the channel layer, next supplying oxygen to the channel layer from an insulating film containing oxygen and reducing oxygen deficiency through second heat treatment after forming the insulating film containing oxygen above the channel layer, then supplying hydrogen to the channel layer from an insulating film containing hydrogen through third heat treatment after forming the insulating film containing hydrogen on the insulating film containing oxygen and terminating defects or uncombined bonds.

PRIOR ART DOCUMENTS

Patent Documents

Patent Document 1: Japanese Patent No. 3208658
Patent Document 2: Japanese Patent No. 4483235
Patent Document 3: Japanese Patent No. 5006598
Patent Document 4: Japanese Patent No. 5100906

SUMMARY OF INVENTION

Problems to be Solved by the Invention

In Patent Document 4 described above, although the insulating film containing hydrogen is formed on the insulating film containing oxygen and the insulating film serves as a supply source of hydrogen, in a case where an amount of hydrogen in the insulating film is large, hydrogen will be excessively supplied to the channel layer. Meanwhile, according to study by the inventors, it is known that in a case where carrier density is equal to or greater than $1\times10^{16}$ pieces/$cm^3$, a threshold voltage defined as a voltage when a drain current becomes $1\times10^{-10}$ A will have a value lower than −10 V, and that turning off cannot be made at a practical voltage. Therefore, in configuration of Cited Document 4, in a case where hydrogen is excessively supplied to the channel layer from the insulating film that serves as the supply source of hydrogen and serves as an electron donor, carrier density will become high and a normal TFT operation cannot be performed.

The present invention has been made in order to solve the above-described problem, and an object of the present invention is to provide a thin film transistor substrate having thin film transistors excellent in initial characteristics and reliability, by inhibiting hydrogen diffusion to the channel layer and limiting a hydrogen concentration in the channel layer at a time of TFT array substrate manufacturing and TFT operation.

Means for Solving the Problems

An aspect of a thin film transistor substrate according to the present invention is a thin film transistor substrate that includes a plurality of pixels arranged in a matrix, each of the pixels including: a thin film transistor including: a gate electrode made of a metal and disposed on the substrate; a gate insulating film covering at least the gate electrode; a semiconductor layer including an oxide semiconductor provided at a position facing the gate electrode with the gate insulating film interposed therebetween; a source electrode and a drain electrode in contact with the semiconductor layer; and an interlayer insulating film provided on at least the semiconductor layer, the source electrode, and the drain electrode; and a pixel electrode electrically connected to the drain electrode. The gate electrode has hydrogen occlusion capability of $2.5 \times 10^{20}$ atoms/cm$^3$ to $2 \times 10^{22}$ atoms/cm$^3$, and the semiconductor layer has a hydrogen concentration of $1 \times 10^{16}$ atoms/cm$^3$ to $3 \times 10^{20}$ atoms/cm$^3$, and wherein the gate electrode includes an Al alloy and N.

Effects of the Invention

With the thin film transistor substrate, since the gate electrode has hydrogen occlusion capability, hydrogen that has diffused from other layers to the gate electrode at a time of heat treatment during a manufacturing process is taken in and retained on a surface or inside, the hydrogen concentration in the semiconductor layer is $1 \times 10^{16}$ atoms/cm$^3$ to $3 \times 10^{20}$ atoms/cm$^3$, carrier density is $1 \times 10^{11}$ atoms/cm$^3$ to $1 \times 10^{16}$ atoms/cm$^3$, the threshold voltage of the thin film transistor is a practical voltage, and the thin film transistor becomes excellent in off characteristics. Also, since hydrogen diffusing at a time of operation of the thin film transistor is also occluded by the gate electrode, it is also possible to inhibit that the hydrogen concentration of the semiconductor layer rises at a time of thin film transistor operation, and a thin film transistor excellent in reliability is obtained with characteristics variation inhibited.

BRIEF DESCRIPTION OF DRAWINGS

FIG. 1 is a plan view that schematically describes configuration of overall of a TFT substrate of a first embodiment according to the present invention.

FIG. 11 is a diagram illustrating the Id-Vg characteristic when the heat treatment temperature of the fourth heat treatment is changed.

FIG. 12 is a diagram illustrating the Id-Vg characteristic when the heat treatment temperature of the fourth heat treatment is changed.

FIG. 14 is a diagram illustrating depth direction distribution of hydrogen in the TFT.

FIG. 15 is a diagram illustrating a relationship between carrier density in a channel layer and a threshold voltage of the TFT.

FIG. 21 is a diagram illustrating the reliability evaluation result of the TFT.

DESCRIPTION OF EMBODIMENTS

First Embodiment

Figure 2:
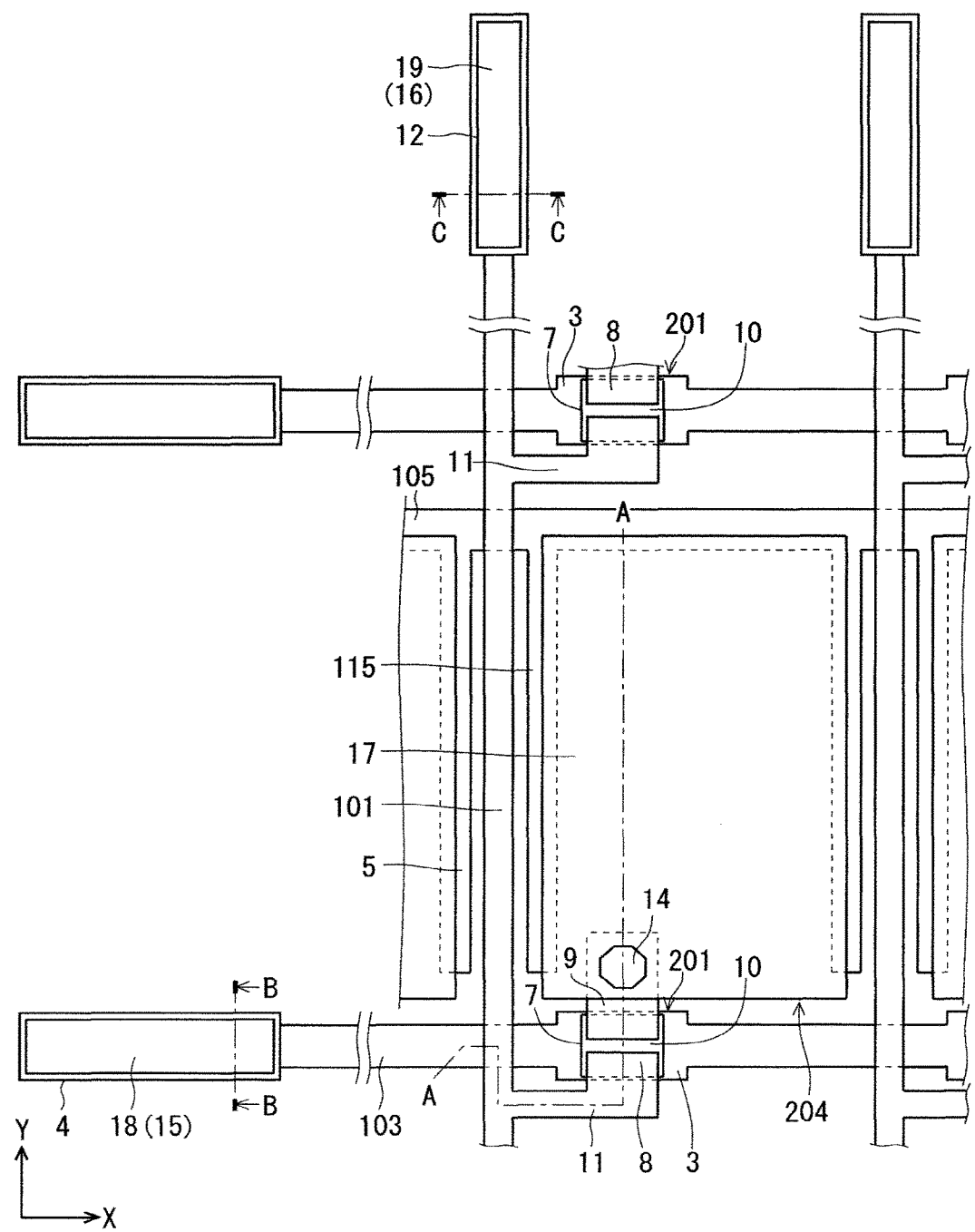
FIG. 2 is a view illustrating planar configuration of a pixel of the TFT substrate of the first embodiment according to the present invention.

Descriptions will be made assuming that a TFT substrate according to a first embodiment is an active matrix substrate on which a thin film transistor (Thin Film Transistor) is used as a switching device.

<Configuration of Overall of TFT Substrate>

FIG. 1 is a plan view that schematically describes configuration of overall of a TFT substrate of the first embodiment according to the present invention, and takes a TFT substrate for an LCD as an example here.

A TFT substrate 200 illustrated in FIG. 1 is a TFT array substrate on which pixel TFTs 201 are arranged in a matrix, and is roughly divided into a display region 202 and a bezel region 203 provided so as to enclose the display region 202.

In the display region 202, a plurality of gate wires (scanning signal lines) 103, a plurality of auxiliary capacitance wires 105, and a plurality of source wires (display signal lines) 101 are arranged, the plurality of gate wires 103 are arranged in parallel with each other, and the plurality of source wires 101 are arranged in parallel with each other so as to intersect the plurality of gate wires 103 at right angles. In FIG. 1, the gate wires 103 are arranged so as to extend horizontally (in an X direction), and the source wires 101 are arranged so as to extend vertically (in a Y direction).

Then, since a region enclosed by two adjacent gate wires 103 and two adjacent source wires 101 is a pixel 204, the TFT substrate 200 has structure in which pixels 204 are arranged in a matrix.

In FIG. 1, part of the pixels 204 is illustrated with structure thereof enlarged, and at least one pixel TFT 201 is disposed within the pixel 204. The pixel 11-T 201 is placed near an interportion of the source wire 101 and the gate wire 103, a gate electrode of the pixel TFT 201 is connected to the gate wire 103, a source electrode of the pixel TFT 201 is connected to the source wire 101, and a drain electrode of the pixel TFT 201 is connected to a transmissive pixel electrode 17. In addition, auxiliary capacitance 209 is connected to the transmissive pixel electrode 17, and the auxiliary capacitance wire 105 provided in parallel with each of the plurality of gate wires 103 also serves as an auxiliary capacitance electrode.

The gate wires 103 and the auxiliary capacitance wires 105 are arranged alternately, and the auxiliary capacitance wires 105 and the source wires 101 are arranged so as to intersect each other at right angles.

In the bezel region 203 of the TFT substrate 200, a scanning signal drive circuit 205 and a display signal drive circuit 206 are provided. The gate wires 103 extend from the display region 202 to the bezel region 203 on a side on which the scanning signal drive circuit 205 is provided, and the gate wires 103 are connected to the scanning signal drive circuit 205 at an end of the TFT substrate 200.

The source wires 101 also extend similarly from the display region 202 to the bezel region 203 on a side on which the display signal drive circuit 206 is provided, and the source wires 101 are connected to the display signal drive circuit 206 at an end of the TFT substrate 200.

In addition, a connection substrate 207 to outside is disposed near the scanning signal drive circuit 205, and a connection substrate 208 to outside is disposed near the display signal drive circuit 206. Note that the connection substrates 207 and 208 are, for example, wiring substrates such as an FPC (Flexible Printed Circuit).

Through the connection substrates 207 and 208, various signals from outside are supplied to the scanning signal drive circuit 205 and the display signal drive circuit 206, respectively. In response to a control signal from outside, the scanning signal drive circuit 205 supplies a gate signal (scanning signal) to the gate wires 103. By this gate signal, the gate wires 103 are sequentially selected. In response to a control signal from outside and display data, the display signal drive circuit 206 supplies a display signal to the source wires 101. With this, a display voltage according to the display data can be supplied to each pixel 204.

Note that the scanning signal drive circuit 205 and the display signal drive circuit 206 are not limited to the configuration of being disposed on the TFT substrate 200, and for example, the drive circuits may be constituted with a TCP (Tape Carrier Package) and may be disposed in a portion different from the TFT substrate 200.

Meanwhile, as will be described later with reference to a plan view, the auxiliary capacitance wire 105 is configured such that part of the auxiliary capacitance wire 105 overlaps (is superimposed on) the transmissive pixel electrode 17 in a plan view, and the auxiliary capacitance 209 is formed with the transmissive pixel electrode 17 as a first electrode and part of the auxiliary capacitance wire 105 as a second electrode. Note that the part of the auxiliary capacitance wire 105 superimposed on the transmissive pixel electrode 17 is referred to as an auxiliary capacitance electrode. All the auxiliary capacitance wires 105 are electrically bound together outside the display region, and for example, common potential is supplied from the display signal drive circuit 206.

The pixel TFT 201 functions as a switching device for supplying the display voltage to the transmissive pixel electrode 17, and on and off of the pixel TFT 201 are controlled by the gate signal input from the gate wire 103. Then, when a predetermined voltage is applied to the gate wire 103 and the pixel TFT 201 turns on, a current flows from the source wire 101. Accordingly, the display voltage is applied from the source wire 101 to the transmissive pixel electrode 17 connected to the drain electrode of the pixel TFT 201, and an electric field according to the display voltage occurs between the transmissive pixel electrode 17 and a counter electrode (not illustrated). Liquid crystal capacitance (not illustrated) is formed by liquid crystal in parallel with the auxiliary capacitance 209 between the transmissive pixel electrode 17 and the counter electrode. Note that for liquid crystal display devices of an In-Plane-Switching method and an FFS (Fringe-Field-Switching) method, the counter electrode is disposed on a TFT substrate 200 side.

The display voltage applied to the transmissive pixel electrode 17 is retained for a certain period by these liquid crystal capacitance and auxiliary capacitance 209. Note that an alignment layer (not illustrated) may be formed on a surface of the TFT substrate 200.

In addition, a counter substrate that is not illustrated is disposed on the TFT substrate 200. The counter substrate is, for example, a color filter substrate, and is disposed on a visual recognition side. On the counter substrate, a color filter, a black matrix (BM), a counter electrode, an alignment layer, and the like are formed.

The TFT substrate 200 and the counter substrate are pasted via a certain gap (cell gap). Then, liquid crystal is injected into this gap and the gap is sealed. That is, a liquid crystal layer is placed between the TFT substrate 200 and the counter substrate. Furthermore, a polarizing plate, a retardation plate, and the like are provided on outside surfaces of the TFT substrate 200 and the counter substrate. In addition, a back light unit and the like are disposed on an opposite side of the visual recognition side of the liquid crystal display panel configured as described above. Since the TFT substrate 200 is disposed on the opposite side of the visual recognition side and the counter substrate is disposed on the visual recognition side, the back light unit is disposed outside the TFT substrate 200.

<Configuration of Pixel on TFT Substrate>

Figure 3:
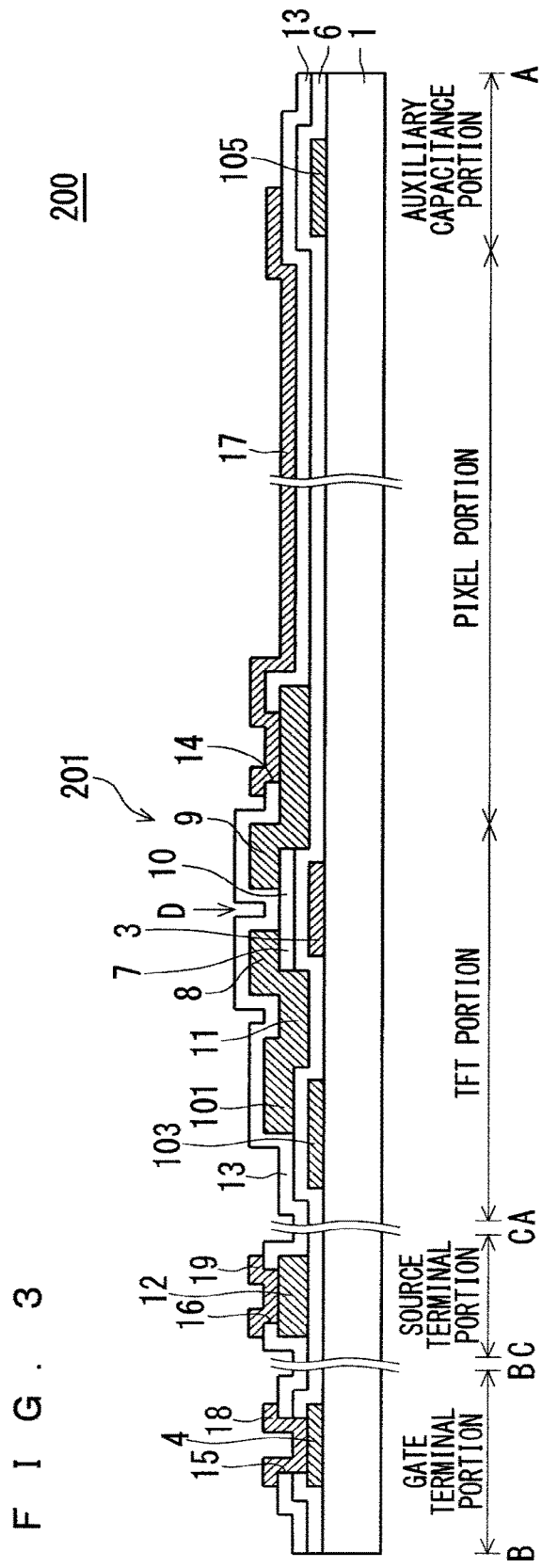
FIG. 3 is a view illustrating cross-portion structure of the pixel of the TFT substrate of the first embodiment according to the present invention.

Next, with reference to FIG. 2 and FIG. 3, structure of the TFT substrate of the first embodiment, more specifically, structure of the bottom-gate type thin film transistor substrate will be described. Note that although the present invention relates to a TFT substrate, the present invention in particular has a characteristic in configuration of a pixel, and thus configuration of the pixel will be described below. FIG. 2 is a plan view illustrating planar configuration of the pixel 204 illustrated in FIG. 1, and FIG. 3 is a cross-portion view illustrating cross-portion configuration taken along the line A-A in FIG. 2 (cross-portion structure of a TFT portion, a pixel portion, and an auxiliary capacitance portion), cross-portion structure taken along the line B-B (cross-portion structure of a gate terminal portion), and cross-portion structure taken along the line C-C (cross-portion structure of a source terminal portion). Note that descriptions will be made below assuming that the TFT substrate 200 is used for a transmissive liquid crystal display device.

As illustrated in FIG. 2, the gate wire 103 with part thereof constituting a gate electrode 3 is arranged so as to extend in the X direction, and in addition, the auxiliary capacitance wire 105 similarly extending in the X direction with part thereof constituting the auxiliary capacitance electrode is arranged in parallel with the gate wire 103 so as to extend in the X direction. In addition, a branch wire 11 extending in the X direction branches from the source wire 101 extending in the Y direction, and an end portion thereof is a source electrode 8.

Then, the transmissive pixel electrode 17 is provided in a pixel region surrounded by the two adjacent gate wires 103 and the two adjacent source wires 101, and the transmissive pixel electrode 17 is connected to a drain electrode 9.

A portion of the gate wire 103 with a line width thereof wider than a line width of other portions functions as the gate electrode 3, a channel layer 7 (semiconductor layer) made of an oxide semiconductor is provided on the gate electrode 3, and the source electrode 8 and the drain electrode 9 are spaced from each other and connected to the channel layer 7. These constitute the pixel TFT 201. Note that at a time of operation of the pixel TFT 201, a channel region 10 is formed within the channel layer 7 between the source electrode 8 and the drain electrode 9.

In the pixel region, the auxiliary capacitance wire 105 has two branch wires 115 extending in the Y direction. The branch wires 115 are provided in a portion corresponding to two peripheral portions on a source wire 101 side of the pixel region, and are arranged such that the auxiliary capacitance wire 105 and the branch wires 115 form a square U-shape in plan view. In addition, the auxiliary capacitance wire 105 and the branch wires 115 in a region where the transmissive pixel electrode 17 is superimposed on the auxiliary capacitance wire 105 serve as the auxiliary capacitance electrode.

Also, configuration formed in which an end of each of the gate wires 103 extending to the bezel region is a gate terminal 4, a gate terminal pad 18 is connected through a gate terminal portion contact hole 15, and a scanning signal of video from outside is provided to the gate terminal 4 through the gate terminal pad 18.

Similarly, structure is formed in which an end of each of the source wires 101 extending to the bezel region is a source terminal 12, a source terminal pad 19 is connected through a source terminal portion contact hole 16, and a video signal from outside is provided to the source terminal 12 through the source terminal pad 19.

Note that structure is formed in which all the auxiliary capacitance wires 105 are electrically bound together in the bezel region, and common potential is provided.

Next, cross-portion structure of the pixel 204 will be described with reference to FIG. 3. As illustrated in FIG. 3, the TFT substrate is configured on a substrate 1, which is for example a transparent insulating substrate such as glass and plastic, and on the substrate 1, the same conductive film is selectively disposed to constitute wires and electrodes.

That is, the gate electrode 3, the gate terminal 4, the gate wire 103, and the auxiliary capacitance wire 105 include a single layer film or a multilayer film of, for example, an alloy film such as an aluminum (Al) alloy or a titanium (Ti) alloy.

In addition, an insulating film 6 is disposed so as to cover these wires and electrodes. Note that the insulating film 6, which functions as a gate insulating film in a portion of the pixel TFT 201, may be referred to as a gate insulating film 6. The gate insulating film 6 includes a lamination film of a silicon nitride film and a silicon oxide film formed thereon.

As illustrated in the TFT portion of FIG. 3, in a formation region of the pixel TFT 201, the channel layer 7 is provided so as to face the gate electrode 3 via the gate insulating film 6. This region has configuration in which the channel layer 7 is formed on the gate insulating film 6 so as to overlap the gate electrode 3 in plan view, and remains within above the gate electrode 3 as much as possible.

The channel layer 7 is formed of an oxide semiconductor, and is formed of an oxide semiconductor containing at least indium (In), gallium (Ga), and zinc (Zn), for example, an In—Ga—Zn—O-based oxide semiconductor with gallium oxide ($Ga_2O_3$) and indium oxide ($In_2O_3$) added to zinc oxide (ZnO). Since an oxide semiconductor has mobility higher than mobility of amorphous silicon, the oxide semiconductor can implement a small and high-performance TFT. Note that besides the above-described In—Ga—Zn—O-based oxide semiconductor, an In—Sn—Ga—Zn—O-based oxide semiconductor that is a quaternary metal oxide, In—Sn—Zn—O-based, In—Al—Zn—O-based, Sn—Ga—Zn—O-based, Al—Ga—Zn—O-based, and Sn—Al—Zn—O-based oxide semiconductors that are ternary metal oxides, In—Zn—O-based, Sn—Zn—O-based, Al—Zn—O-based, Zn—Mg—O-based, Sn—Mg—O-based, In—Mg—O-based, and In—Ga—O-based oxide semiconductors that are binary metal oxides, In—O-based, Sn—O-based, and Zn—O-based oxide semiconductors can be used. Note that in this specification, for example, the In—Ga—Zn—O-based oxide semiconductor means a metal oxide having indium (In), gallium (Ga), and zinc (Zn), regardless of a stoichiometry composition ratio thereof. Moreover, the oxide semiconductor may also contain silicon.

In addition, the source electrode 8 and the drain electrode 9 made of conductive films are spaced on the channel layer 7, and at a time of operation of the pixel TFT 201, the channel region 10 is formed within the channel layer 7 between the source electrode 8 and the drain electrode 9.

Also, the source electrode 8, the drain electrode 9, the branch wire 11, and the source wire 101 of the TFT portion, and the source terminal 12 of the source terminal portion are covered with an interlayer insulating film 13. Note that the interlayer insulating film 13 covers the gate insulating film 6 of the gate terminal portion, and covers the gate insulating film 6 of the pixel portion and the auxiliary capacitance portion.

The pixel portion has structure in which the transmissive pixel electrode 17 made of a transparent conductive film is formed on the interlayer insulating film 13, and the transmissive pixel electrode 17 is configuration of connected to the drain electrode 9 through a pixel drain contact hole 14 that passes through the interlayer insulating film 13 and reaches the drain electrode 9.

Also, the source terminal portion has configuration in which the source terminal pad 19 is connected to the source terminal 12 through the source terminal portion contact hole 16 that passes through the interlayer insulating film 13 and reaches the source terminal 12.

Also, the gate terminal portion has structure in which the gate terminal pad 18 is connected to the gate terminal 4 through the gate terminal portion contact hole 15 that passes through the interlayer insulating film 13 and the gate insulating film 6 and reaches the gate terminal 4.

<Manufacturing Method>

Figure 8:
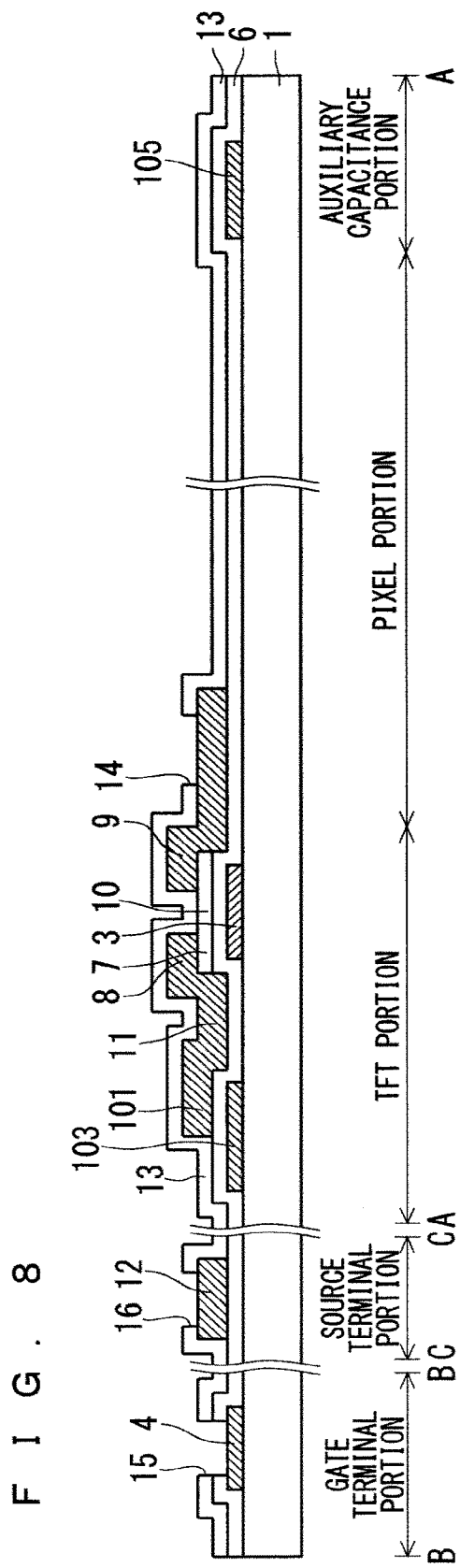
FIG. 8 is a cross-portion view illustrating the manufacturing process of the TFT substrate of the first embodiment according to the present invention.
Figure 9:
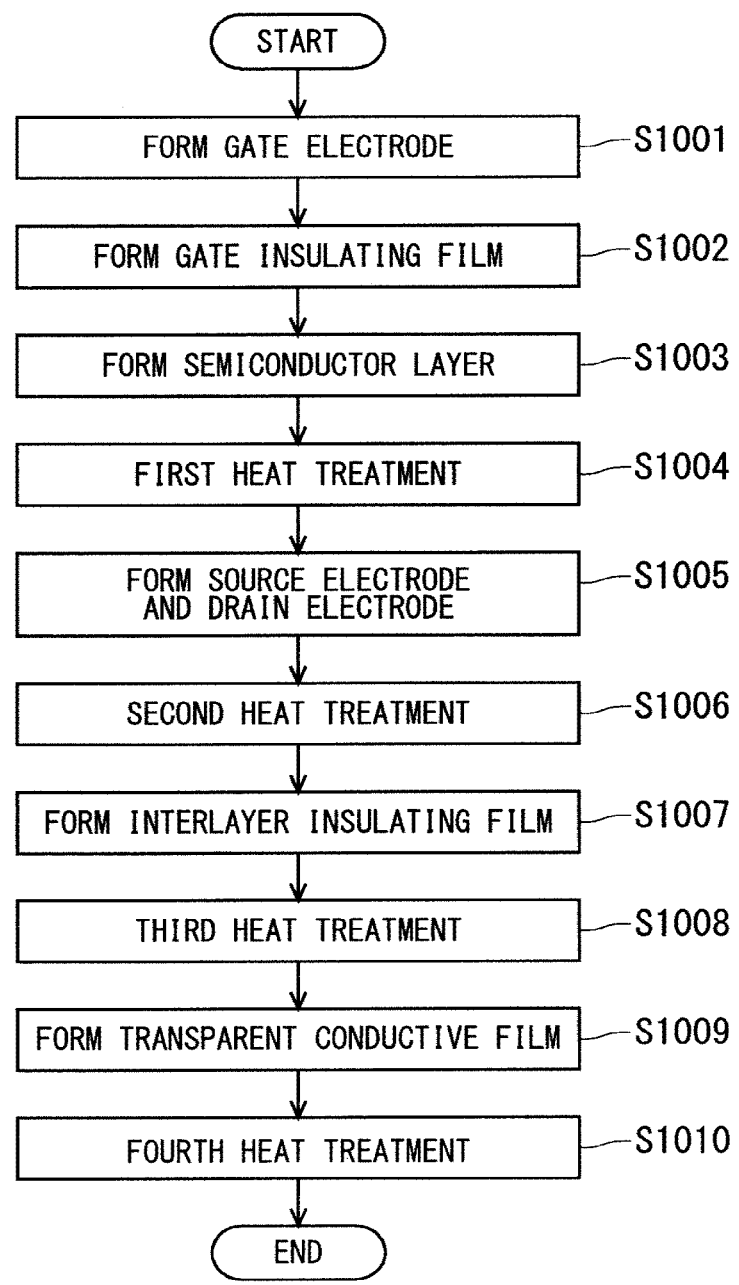
FIG. 9 is a flowchart illustrating the manufacturing process of the TFT substrate of the first embodiment according to the present invention.

Next, a manufacturing method of the TFT substrate of the first embodiment according to the present invention will be described with reference to FIG. 4 to FIG. 8, which are cross-portion views illustrating a manufacturing process sequentially. Note that FIG. 4 to FIG. 8 are cross-portion views corresponding to the cross-portion view illustrated in FIG. 3, and FIG. 3 corresponds to the cross-portion view illustrating a final process. In addition, FIG. 9 is a flowchart illustrating a procedure of the manufacturing method of the TFT substrate of the first embodiment of the present invention, and hereinafter, while referring to FIG. 4 to FIG. 8, description will be made along the flowchart illustrated in step S1001 to step S1010 of FIG. 9.

Figure 4:
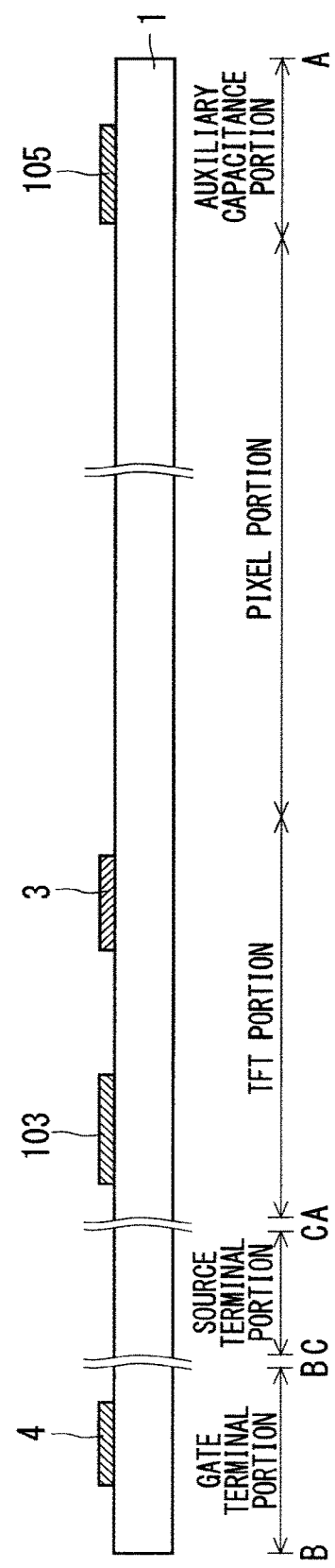
FIG. 4 is a cross-portion view illustrating a manufacturing process of the TFT substrate of the first embodiment according to the present invention.

To begin with, after the substrate 1, which is a transparent insulating substrate such as glass, is cleaned using cleaning fluid or pure water and a metal film (first metal film) that occludes hydrogen such as an Al alloy or a Ti alloy is formed on the substrate 1, by patterning the metal film in a first photolithographic process, as illustrated in FIG. 4, the gate electrode 3, the gate terminal 4, the gate wire 103, and the auxiliary capacitance wire 105 are formed on the substrate 1 (step S1001).

As the metal film that occludes hydrogen, it is preferable to use a metal with low electric specific resistance and an alloy such as an Al alloy or a Ti alloy. Furthermore, from a viewpoint of electric specific resistance reduction, lamination structure that is obtained by laminating, on an Al alloy that contains Al as a main component with nickel (Ni) or neodymium (Nd) added, an AlN alloy obtained by further adding nitrogen (N) to the above alloy is more preferable. Also, a thickness of the metal film that occludes hydrogen is preferably 50 to 300 nm from a viewpoint of uniformity and coverage.

More specifically, a lamination film obtained by laminating an AlNiNdN film on an AlNiNd film is formed by known a sputtering method using an argon (Ar) gas or a krypton (Kr) gas.

A sputtering condition is a DC magnetron sputtering method, an AlNiNd alloy target is used, and the AlNiNd film with a thickness of about 200 nm is formed as a lower-layer film under a condition of power density of 3 W/cm$^2$ and Ar gas flow quantity of 40 sccm.

Next, the same target material is used, the AlNiNdN film with a thickness of about 50 nm is formed as an upper-layer film under a condition of power density of 3 W/cm$^2$, Ar gas flow quantity of 40 sccm, and N$_2$ gas flow quantity of 20 sccm, and then a lamination film with a thickness of 250 nm is obtained.

Next, a resist material is applied onto the lamination film, the applied resist material is exposed using a photomask, and the resist material is exposed to light. Next, a photoresist pattern is obtained by developing the resist material exposed to light and patterning the resist material. Hereinafter, a series of these processes of foliating the photoresist pattern is referred to as a photolithographic process.

Subsequently, by using this photoresist pattern as a mask, collectively etching the lamination film of the AlNiNdN film and the AlNiNd film using a known medical fluid containing a phosphoric acid, for example, a mixed acid of a phosphoric acid, an acetic acid, and a nitric acid (hereinafter referred to as "PAN"), and by eliminating the photoresist pattern, as illustrated in FIG. 4, the gate electrode 3, the gate terminal 4, the gate wire 103, and the auxiliary capacitance wire 105 are formed on the substrate 1. The AlNiNdN film formed here, which receives oxygen (O) from an atmosphere that is being formed or an upper-layer film to be formed later, and has structure of having Al, N, and O, will have hydrogen occlusion capability.

That is, the upper-layer AlNiNdN film is a film that can take in hydrogen diffused from a further upper-layer film and has hydrogen occlusion capability of containing hydrogen in a range of from $2.5 \times 10^{20}$ atoms/cm$^3$ to $2 \times 10^{22}$ atoms/cm$^3$. Note that in order to form the AlNiNdN film having such hydrogen occlusion capability, it is preferable to set a process temperature (substrate temperature) at about 100° C.

Figure 5:
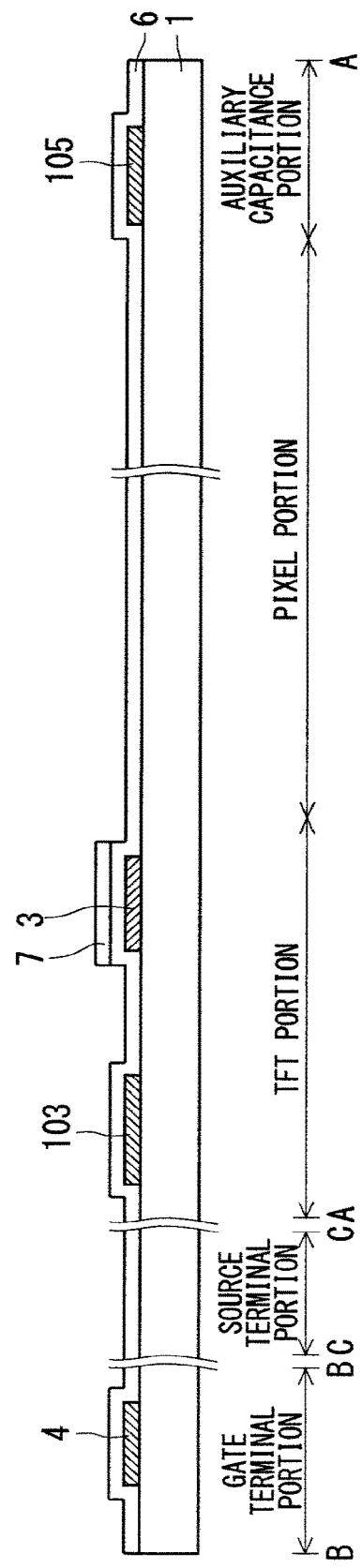
FIG. 5 is a cross-portion view illustrating the manufacturing process of the TFT substrate of the first embodiment according to the present invention.

Next, in the process illustrated in FIG. 5, the gate insulating film 6 is formed on the substrate 1, and the gate insulating film 6 covers the gate electrode 3, the gate terminal 4, the gate wire 103, and the auxiliary capacitance wire 105 (step S1002). The gate insulating film 6 includes a lamination film obtained by laminating a silicon oxide (SiO) film on a silicon nitride (SiN) film. A thickness of the overall gate insulating film 6, which varies depending on a dielectric constant of a material that constitutes the lamination film and an operating voltage of the thin film transistor (on-state voltage), is preferably 150 to 500 nm.

More specifically, chemical vapor deposition (CVD) is used, and to begin with, under an about 340° C. substrate-heating condition, a mixed gas of SiH$_4$, NH$_4$, and N$_2$ is used, and under a condition that a ratio of NH$_3$ to SiH$_4$ is 1.5 (NH$_3$/SiH$_4$=1.5), a lower-layer SiN film is formed with a thickness of 400 nm. Subsequently, under the about 340° C. substrate-heating condition, a mixed gas of SiH$_4$ and N$_2$O is used, and under a condition that a ratio of N$_2$O to SiH$_4$ is 75 (N$_2$O/SiH$_4$=75), an upper-layer SiO film is formed with a thickness of 50 nm.

Note that although the present first embodiment has illustrated an example of using CVD as the formation method of the SiO film and the SiN film, a sputtering method or ion-plating method may be used.

Next, by forming, on the gate insulating film 6, an oxide semiconductor film as a material of the channel layer 7 and patterning the oxide semiconductor film in a second photolithographic process, as illustrated in FIG. 5, the channel layer 7 is formed above the gate electrode 3 of the TFT portion (step S1003). Note that a film thickness of the channel layer 7 is preferably 10 to 100 nm from a viewpoint of film uniformity and carrier density.

After formation of the channel layer 7, first heat treatment (annealing treatment) is performed (step S1004). Since objects of this heat treatment is to reduce surplus hydrogen in the oxide semiconductor film, to supply oxygen, and to reduce defects, heat treatment is preferably performed under an atmosphere containing oxygen of an oxygen concentration equal to or higher than an atmospheric oxygen concentration (20%), and a heat treatment temperature is preferably set at 300 to 450° C. A reason to set the heat treatment temperature at equal to or higher than 300° C. is that, if lower than 300° C., hydrogen is not sufficiently discharged from the oxide semiconductor film, and that oxygen is not sufficiently supplied to the oxide semiconductor film. A reason for equal to or lower than 450° C. is that, if higher than 450° C., composition change will occur resulting from a desorption rate of an element in the oxide semiconductor film varying with a type of element (amount of desorption is particularly large in Zn).

More specifically, by a sputtering method using an InGaZnO target with an atomic composition ratio of In:Ga:Zn:O of 1:1:1:4, an InGaZnO film with the atomic composition ratio of In:Ga:Zn:O of 1:1:1:4 is formed with a thickness of 40 nm. By this method, an oxygen ion-deficient oxide film with the atomic composition ratio of oxygen less than stoichiometry composition (in the above-described example, the composition ratio of O is less than 4) is likely to be formed. Therefore, it is preferable to perform sputtering with an oxygen ($O_2$) gas mixed in an Ar gas. Here, sputtering is performed using a mixed gas obtained by adding 10% $O_2$ gas by a division ratio to an Ar gas. This InGaZnO film is amorphous structure. Also, the InGaZnO film with amorphous structure has a crystallization temperature of 500° C. or higher in general and is stable with most portion of the film as amorphous structure at normal temperatures.

Subsequently, a resist material is applied onto the InGaZnO film of amorphous structure, and the photoresist pattern is formed in the second photolithographic process. Then, the InGaZnO film is patterned by etching using the photoresist pattern as a mask. Wet etching with a solution containing an oxalic acid can be used for etching of the InGaZnO film. As the solution containing an oxalic acid, a solution containing an oxalic acid in a range of from 1 to 10 wt % is preferable. In the present first embodiment, a solution containing an oxalic acid at 5 wt % is used.

After patterning of the InGaZnO film, by eliminating the photoresist pattern, the channel layer 7 illustrated in FIG. 5 is obtained. Subsequently, heat treatment for 60 minutes is performed under a condition that the substrate temperature is 350° C. in an atmosphere containing oxygen.

Note that although the above description has indicated an example in which the atomic composition ratio of the InGaZnO film is In:Ga:Zn:O=1:1:1:4, the atomic composition ratio may be In:Ga:Zn:O=2:2:1:7. Also, for homologous structure ($InGaO_3(ZnO)_m$:(m>0)), a composition ratio other than the above-described composition ratio is also applicable.

Figure 6:
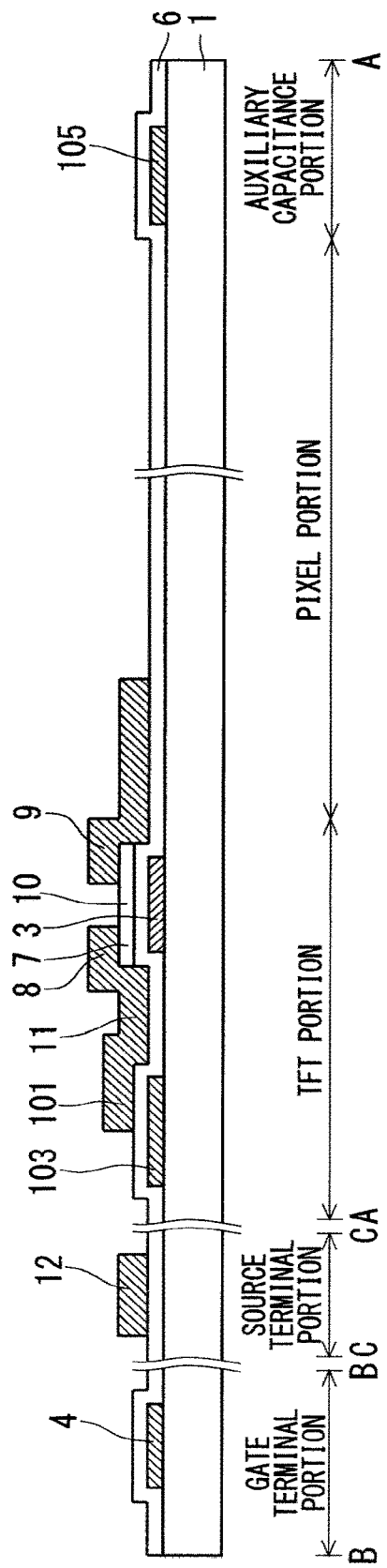
FIG. 6 is a cross-portion view illustrating the manufacturing process of the TFT substrate of the first embodiment according to the present invention.

Next, by forming a metal film (second metal film) on the gate insulating film 6 including on the channel layer 7, and patterning the metal film through a third photolithographic process, as illustrated in FIG. 6, the source electrode 8, the drain electrode 9, the branch wire 11, the source wire 101, and the source terminal 12 are formed (step S1005).

As the metal film to be formed in this process, it is preferable to use an alloy film having characteristics such as low electric specific resistance, indicating good contact characteristics with the channel layer 7, and good contact characteristics with the conductive film used for the transmissive pixel electrode 17 (in particular, low electric contact resistance). Note that a film thickness of the metal film is preferably 50 to 300 nm from a viewpoint of film uniformity and coverage.

After formation of the metal film, second heat treatment is performed (step S1006). Since objects of this heat treatment is to reduce surplus hydrogen in the oxide semiconductor and to supply oxygen to each layer, as in the heat treatment after the channel layer formation, this heat treatment is preferably performed under an atmosphere containing oxygen of an oxygen concentration equal to or higher than an atmospheric oxygen concentration. Also, the heat treatment temperature of 300 to 350° C. is preferable. A reason for equal to or higher than 300° C. is that, if lower than 300° C., hydrogen is not sufficiently discharged from the oxide semiconductor film, and that oxygen is not sufficiently supplied to the oxide semiconductor film. A reason for equal to or lower than 350° C. is that, if higher than 350° C., an amount of metal diffusion from the source electrode 8 and the drain electrode 9 to the channel layer 7 becomes significant and affects characteristics.

More specifically, a lamination film obtained by laminating an AlNiNd film on an AlNiNdN film is formed by a known sputtering method using an Ar gas or a Kr gas.

The sputtering condition is a DC magnetron sputtering method, an AlNiNd alloy target is used, and the AlNiNdN film with a thickness of about 50 nm is formed as a lower-layer film under a condition of power density of 3 $W/cm^2$, Ar gas flow quantity of 40 sccm, and $N_2$ gas flow quantity of 20 sccm.

Next, the same target material is used, the AlNiNd film with a thickness of about 200 nm is formed as an upper-layer film under a condition of power density of 3 $W/cm^2$ and Ar gas flow quantity of 40 sccm, and then a lamination film with a thickness of 250 nm is obtained.

Next, a resist material is applied onto the lamination film, and a photoresist pattern is formed in the third photolithographic process. Then, by using the photoresist pattern as a mask, collectively etching the lamination film of the AlNiNd film and the AlNiNdN film using a known medical fluid containing a known phosphoric acid, for example, PAN, and by eliminating the photoresist pattern, as illustrated in FIG. 6, the source electrode 8, the drain electrode 9, the branch wire 11, the source wire 101, and the source terminal 12 are formed.

Subsequently, heat treatment for 1 hour is performed at 350° C. in the air. With this, oxygen is supplied from the atmosphere to each layer including the channel layer, and the uncombined bond of each layer is terminated by oxygen.

Note that although an example of using the mixed gas of an Ar gas and an $N_2$ gas for formation of the AlNiNdN film as a sputtering gas has been described above, a Kr gas may be used instead of an Ar gas. Also, in a case where N is added to an Al film, a gas to be added at a time of sputtering is not limited to an $N_2$ gas, and a gas containing N, for example $NH_3$, can add N into the Al film. Also, an AlNiN alloy with N added to a sputtering target in advance may be used. In this case, it is not necessarily required to use a mixed gas obtained by adding a gas containing $N_2$ or N to an Ar gas or a Kr gas as a sputtering gas, and it is possible for an Ar gas or a Kr gas to add N to an Al film by itself.

Figure 7:
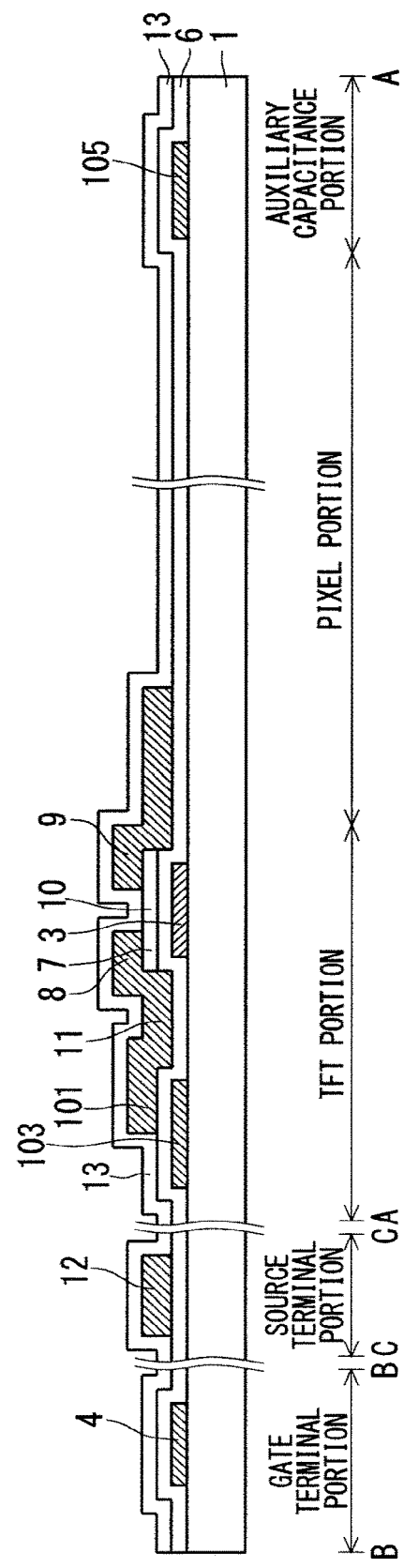
FIG. 7 is a cross-portion view illustrating the manufacturing process of the TFT substrate of the first embodiment according to the present invention.

Next, in the process illustrated in FIG. 7, the interlayer insulating film 13 as a passivation film is formed so as to cover the source electrode 8, the drain electrode 9, the branch wire 11, the source wire 101, and the source terminal 12 (step S1007).

The interlayer insulating film 13 includes a lamination film of a lower-layer film and an upper-layer film, and after the lower-layer film is formed, third heat treatment is performed (step S1008). This heat treatment is performed with objects of reducing surplus hydrogen in the oxide semiconductor and supplying oxygen to each layer from an atmosphere and the lower-layer film. In order to perform supply of oxygen sufficiently, it is preferable to perform heat treatment under an atmosphere containing oxygen of an oxygen concentration equal to or higher than an atmospheric oxygen concentration and to perform heat treatment at temperatures of from 200 to 350° C. A reason for equal to or higher than 200° C. is that, if lower than 200° C., oxygen is not sufficiently supplied to the channel layer 7. A reason for equal to or lower than 350° C. is that, if higher than 350° C., the amount of metal diffusion from the source electrode 8 and the drain electrode 9 to the channel layer 7 becomes significant and affects characteristics.

After the heat treatment, the upper-layer film is formed. Here, a thickness of the overall interlayer insulating film 13, which varies depending on a dielectric constant of a material that constitutes the lamination film and an operating voltage of the thin film transistor (on-state voltage), is preferably 150 to 500 nm.

More specifically, CVD is used, and to begin with, under an about 200° C. substrate-heating condition, a mixed gas of $SiH_4$ and $N_2O$ is used, and under a condition that a ratio of $N_2O$ to $SiH_4$ is 150 ($N_2O/SiH_4$=150), a lower-layer SiO film is formed with a thickness of 200 nm. Subsequently, heat treatment is performed through retention for 60 minutes under a 280° C. temperature condition in an atmosphere of the air.

Next, CVD is used, and under an about 160° C. substrate-heating condition, a mixed gas of $SiH_4$, $NH_4$, $N_2$, and $H_2$ is used, and under a condition that a ratio of $NH_4$ to $SiH_4$ is 0.7 ($NH_4/SiH_4$=0.7), an upper-layer SiN film is formed with a thickness of 150 nm.

Subsequently, a resist material is applied onto the interlayer insulating film 13, and the photoresist pattern is formed in a fourth photolithographic process. Then, by known dry etching using a fluorine-based gas with the photoresist pattern as a mask, the pixel drain contact hole 14 that reaches at least a surface of the drain electrode 9, the gate terminal portion contact hole 15 that reaches a surface of the gate terminal 4, and the source terminal portion contact hole 16 that reaches a surface of the source terminal 12 are formed simultaneously. Subsequently, by eliminating the photoresist pattern, as illustrated in FIG. 8, the pixel drain contact hole 14, the gate terminal portion contact hole 15, and the source terminal portion contact hole 16 are obtained.

Note that although the present first embodiment has illustrated an example of using CVD as the formation method of the SiO film and the SiN film, a sputtering method or ion-plating method may be used.

Next, by forming a transparent conductive film on the interlayer insulating film 13, embedding the transparent conductive film within the pixel drain contact hole 14, the gate terminal portion contact hole 15, and the source terminal portion contact hole 16, and patterning the transparent conductive film through a fifth photolithographic process, as illustrated in FIG. 3, by forming the transmissive pixel electrode 17 connected to the lower-layer drain electrode 9 through the pixel drain contact hole 14 and forming the gate terminal pad 18 and the source terminal pad 19 connected to the gate terminal 4 and the source terminal 12 through the gate terminal portion contact hole 15 and the source terminal portion contact hole 16, respectively, the TFT substrate 200 is completed (step S1009).

Note that fourth heat treatment is applied to the completed TFT substrate 200 at a temperature of from 200 to 350° C. and under an atmosphere containing oxygen of an oxygen concentration equal to or higher than an atmospheric oxygen concentration (step S1010). With this, by causing hydrogen in the overall TFT substrate to diffuse and to be occluded by the gate electrode 3 or to be discharged outside the substrate, the hydrogen concentration in the overall TFT substrate can be reduced, and TFT characteristics can be improved and stabilized. Here, since oxygen is sufficiently supplied to each layer through the first to third heat treatment, the uncombined bond of each layer is terminated by oxygen. As a result, an amount of diffused hydrogen captured by the uncombined bond of each layer is small at a time of the fourth heat treatment. Therefore, the hydrogen concentration in the overall TFT substrate can be reduced effectively. Note that a reason for the heat treatment temperature equal to or higher than 200° C. is that, if lower than 200° C., the amount of diffusion of hydrogen in the TFT substrate decreases, and that the hydrogen concentration of the TFT substrate cannot be sufficiently reduced. A reason for equal to or lower than 350° C. is that, if higher than 350° C., an amount of metal diffusion from the source electrode 8 and the drain electrode 9 to the channel layer 7 becomes significant and affects characteristics.

More specifically, after an IZO film obtained by mixing indium oxide ($In_2O_3$) and zinc oxide (ZnO) as the transparent conductive film is formed with a thickness of 100 nm by the known sputtering method using an Ar gas, a resist material is applied onto the IZO film, and a photoresist pattern is formed in a fifth photolithographic process. Then, the IZO film is patterned by etching using the photoresist pattern as a mask. Wet etching with a solution containing an oxalic acid can be used for etching of the IZO film. Then, by eliminating the photoresist pattern, the TFT substrate 200 on which the transmissive pixel electrode 17, the gate terminal pad 18, and the source terminal pad 19 are formed is obtained.

Subsequently, by retaining the TFT substrate 200 in the air for 60 minutes at about 230° C. and performing heat treatment, the TFT substrate 200 is completed.

Figure 10:
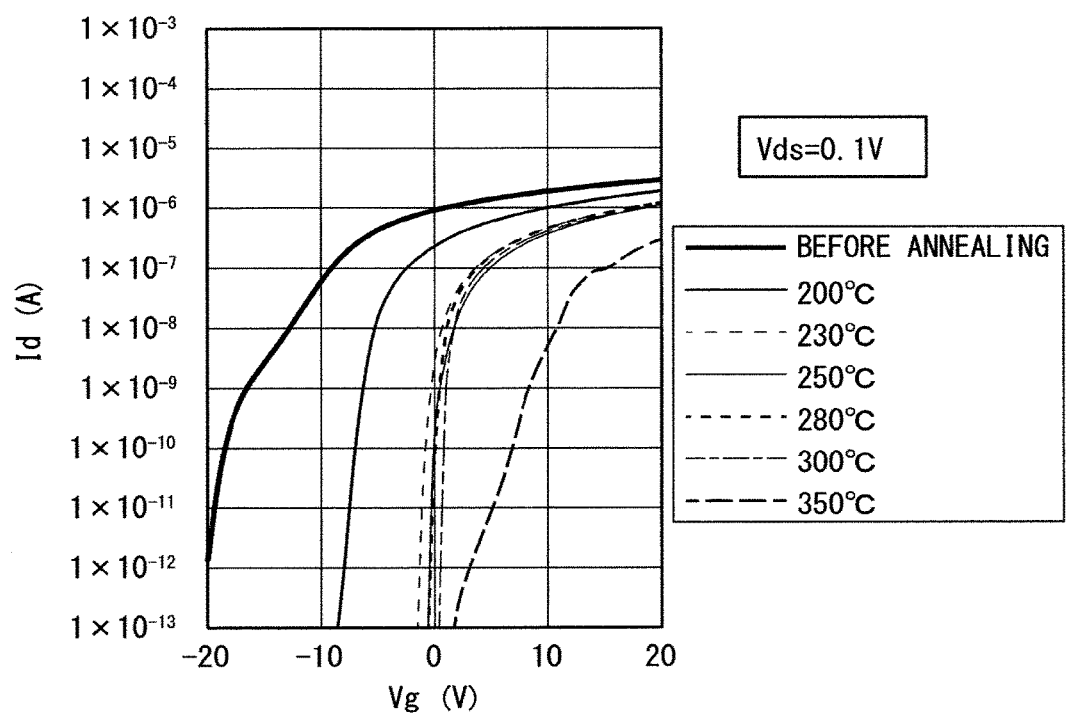
FIG. 10 is a diagram illustrating an Id-Vg characteristic when a heat treatment temperature of fourth heat treatment is changed.

Next, effects produced by the fourth heat treatment (annealing treatment) to be performed lastly will be described with reference to FIG. 10 to FIG. 12. FIG. 10 to FIG. 12 are diagrams each illustrating a characteristic of a drain current (Id) with respect to a gate voltage (Vg) of a thin film transistor (Id-Vg characteristic) in cases where a drain-source voltage (Vds) is 0.1 V, 1 V and 10 V, respectively, in a case where the heat treatment temperature is varied in a range from 200 to 350° C.

That is, FIG. 10 illustrates, in a case where Vds is 0.1 V, the Id-Vg characteristic in a case of before annealing treatment and in cases where annealing treatment is performed at 200° C., 230° C., 250° C., 280° C., 300° C., and 350° C. Also, FIG. 11 illustrates, in a case where Vds is 1 V, the Id-Vg characteristic in a case of before annealing treatment and in cases where annealing treatment is performed at 200° C., 230° C., 250° C., 280° C., 300° C., and 350° C. Also, FIG. 12 illustrates, in a case where Vds is 10 V, the Id-Vg characteristic in a case of before annealing treatment and in cases where annealing treatment is performed at 200° C., 230° C., 250° C., 280° C., 300° C., and 350° C.

What is common to FIG. 10 to FIG. 12 is that a threshold voltage is lower than −10 V when annealing treatment is not performed and that a thin film transistor cannot be turned off at practical voltages. Also, FIG. 10 to FIG. 12 indicate that as the annealing treatment temperature increases, the threshold voltage is shifted to a plus side, and in a case where the annealing treatment temperature is 350° C., the threshold voltage has a value from several V to less than 10 V. Therefore, it can be said that when the annealing treatment temperature is set in a range from 200 to 350° C., a thin film transistor with a good off characteristic can be obtained. Note that by setting the annealing treatment temperature at 230 to 300° C., a thin film transistor with a more excellent off characteristic can be obtained.

Next, a result of measuring, by secondary ion mass spectrometry (SIMS), depth direction distribution of hydrogen (hydrogen profile) in the TFT portion of the TFT substrate 200 produced by the above-described manufacturing method will be described with reference to FIG. 13 and FIG. 14.

Figure 13:
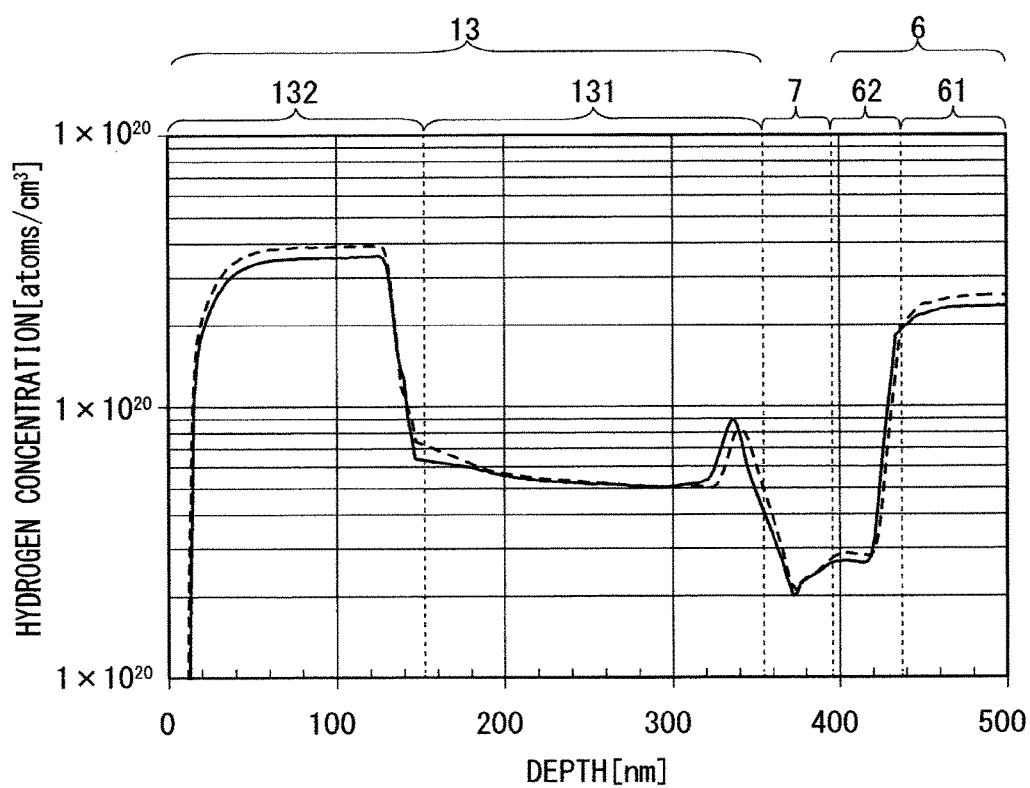
FIG. 13 is a diagram illustrating depth direction distribution of hydrogen in a TFT.

FIG. 13 is a general diagram illustrating a hydrogen profile in a central portion of the gate electrode 3 in the TFT portion, that is, in a portion indicated by an arrow D in FIG. 3, whereas FIG. 14 is a diagram of a hydrogen profile in the channel layer 7 and a nearby layer thereof.

While the hydrogen profile illustrated in FIG. 13 indicates the depth direction distribution of hydrogen in the interlayer insulating film 13, the channel layer 7, and the gate insulating film 6, since the interlayer insulating film 13 and the gate insulating film 6 both include two-layer lamination films, individual films are also separately illustrated for convenience.

That is, the interlayer insulating film 13 is divided into the upper-layer SiN film as an upper-layer interlayer insulating film 132 and the lower-layer SiO film as a lower-layer interlayer insulating film 131, whereas the gate insulating film 6 is divided into the upper-layer SiO film as an upper-layer gate insulating film 62 and the lower-layer SiN film as a lower-layer gate insulating film 61.

In addition, FIG. 14 illustrates the hydrogen profile of part of the lower-layer interlayer insulating film 131, the overall channel layer 7, and part of the upper-layer gate insulating film 62, and in FIG. 13 and FIG. 14, a dashed line illustrates the hydrogen profile before the fourth heat treatment, and a solid line illustrates the hydrogen profile after the fourth heat treatment.

FIG. 13 and FIG. 14 indicate that hydrogen in the interlayer insulating film 13, the channel layer 7, and the gate insulating film 6 is reduced by performing the fourth heat treatment.

Also, from FIG. 13 and FIG. 14, the lowest hydrogen concentration in the channel layer 7 (oxide semiconductor) after the fourth heat treatment is $2.0 \times 10^{20}$ atoms/cm$^3$, and the lowest hydrogen concentration in the lower-layer gate insulating film 61 is $2.3 \times 10^{21}$ atoms/cm$^3$.

Here, FIG. 15 illustrates a relationship between carrier density (piece/cm$^3$) in the channel layer 7 and the TFT threshold voltage (V). As illustrated in FIG. 15, in order to make the threshold voltage in a range of from −10 to 0 V, which is a practical value as a TFT, it is necessary to make the carrier density equal to or less than $1 \times 10^{16}$ pieces/cm$^3$. There is a correlation between the hydrogen concentration in the channel layer and the carrier density, and when the hydrogen concentration in the channel layer is equal to or less than $3 \times 10^{20}$ atoms/cm$^3$, the carrier density is $1 \times 10^{16}$ pieces/cm$^3$. Note that in a case where the carrier density is too low, turning on cannot be performed even if the gate voltage is applied, and thus the carrier density needs to be higher than $1 \times 10^{11}$ pieces/cm$^3$.

In addition, the carrier density can be measured by Hall effect measurement, and by measuring the carrier density by Hall effect measurement of TEG (test element group) produced under the same condition as an actual TFT substrate, and meanwhile by measuring the TFT threshold voltage in the actual TFT substrate, the correlation between the carrier density and the threshold voltage as illustrated in FIG. 15 is obtained.

As described above, in the TFT substrate 200 of the present embodiment, the hydrogen concentration in the channel layer 7 (oxide semiconductor) satisfies this condition, and thus the carrier density is equal to or less than $1 \times 10^{16}$ pieces/cm$^3$. Note that in a case where the hydrogen concentration is too low, hydrogen that terminates the uncombined bond in the oxide semiconductor is insufficient, and thus the carrier density will increase. Therefore, the hydrogen concentration in the oxide semiconductor needs to be equal to or greater than $1 \times 10^{16}$ atoms/cm$^3$.

Figure 16:
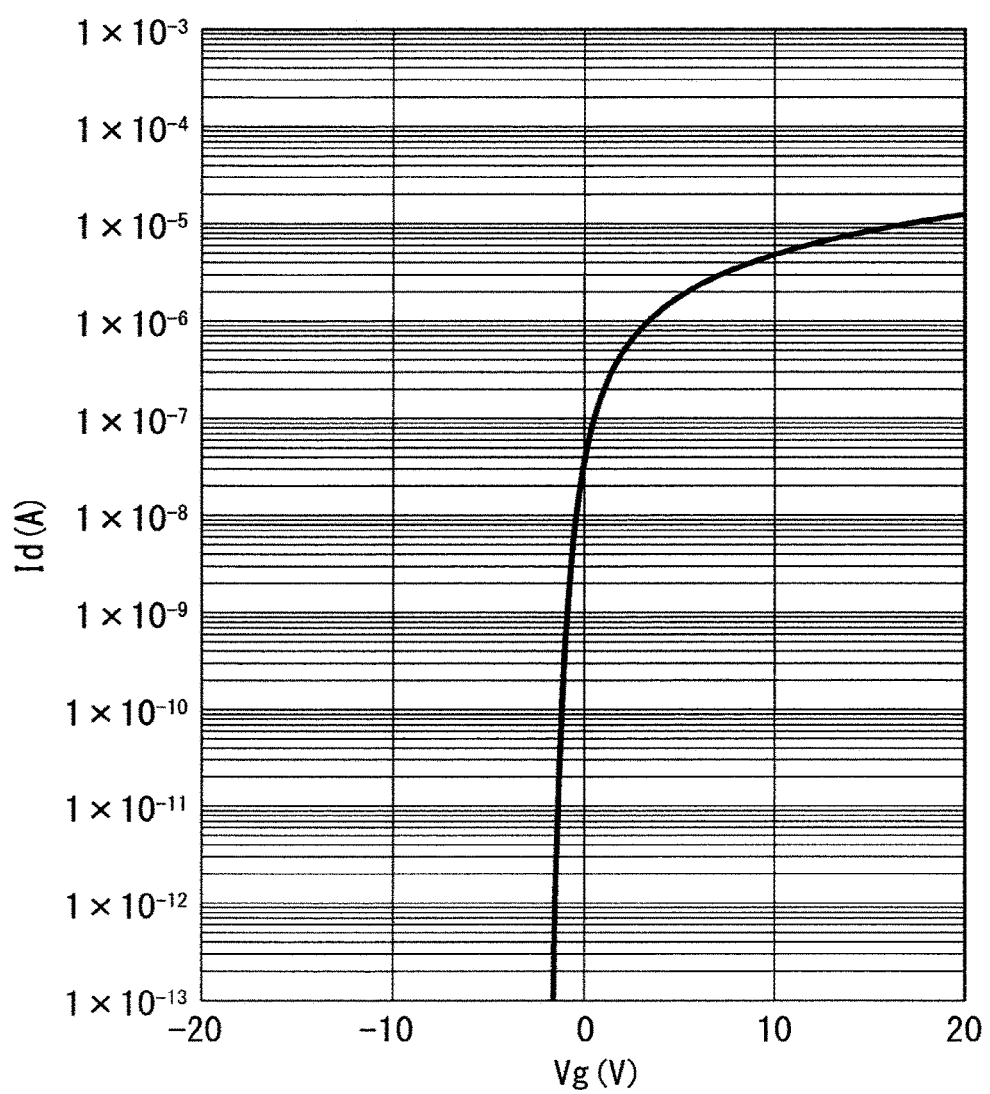
FIG. 16 is a diagram illustrating the Id-Vg characteristic when the fourth heat treatment is performed at 250° C.

Here, FIG. 16 illustrates the characteristic of the drain current (Id) with respect to the gate voltage (Vg) of the thin film transistor (Id-Vg characteristic), which corresponds to the characteristic when 230° C. annealing treatment is performed among the Id-Vg characteristics illustrated in FIG. 11. As illustrated in FIG. 16, the TFT threshold voltage is equal to or greater than −10 V, which indicates that FIG. 16 illustrates good off characteristics.

Figure 17:
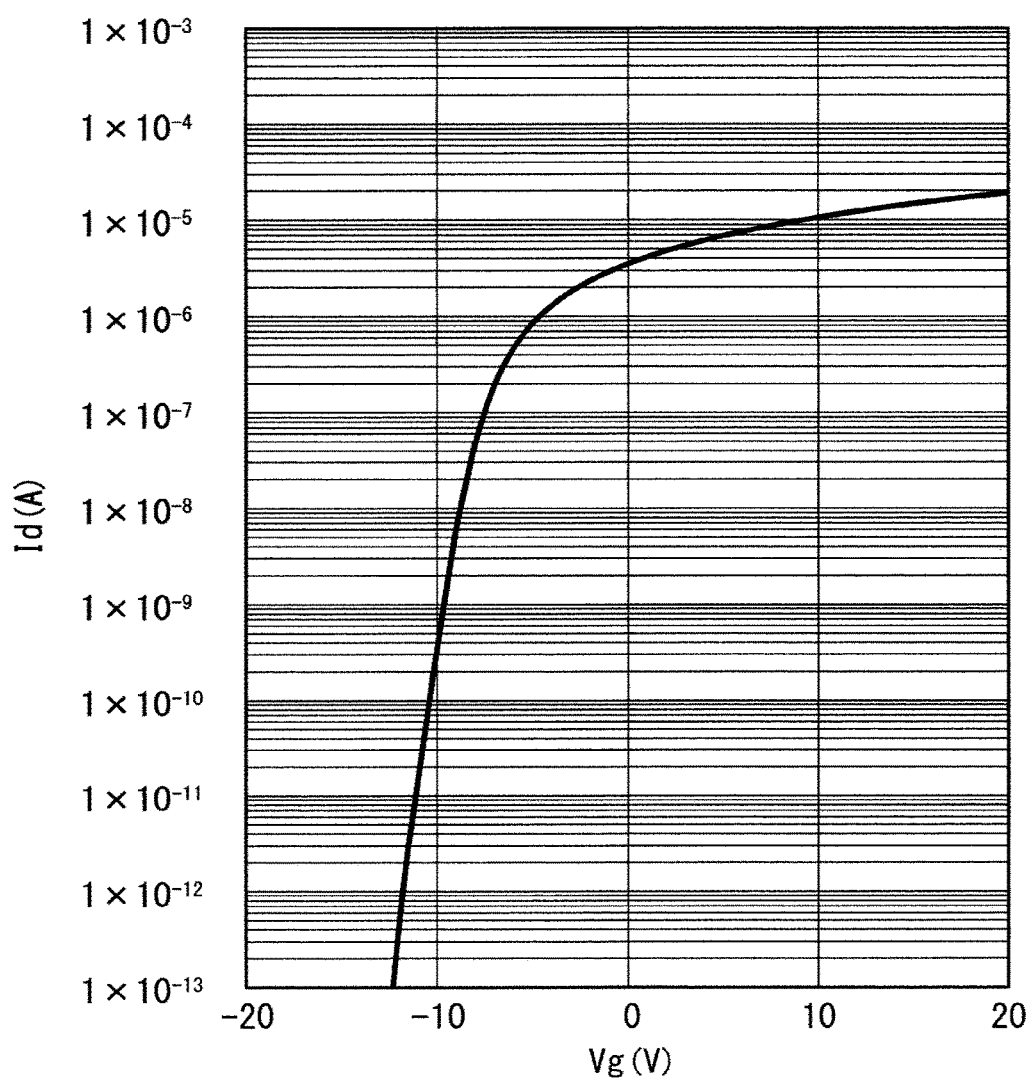
FIG. 17 is a diagram illustrating the Id-Vg characteristic when a hydrogen concentration in the channel layer exceeds $3 \times 10^{20}$ atoms/cm$^3$.

Meanwhile, FIG. 17 illustrates the Id-Vg characteristic of the thin film transistor produced with the third heat treatment omitted. The hydrogen concentration in the channel layer of this thin film transistor is higher than $3 \times 10^{20}$ atoms/cm$^3$ (that is, carrier density is higher than $1 \times 10^{16}$ pieces/cm$^3$). In this case, the threshold voltage is lower than −10 V, the thin film transistor cannot be turned off at practical voltages, and there is a problem in off characteristics. Note that the characteristics of FIG. 16 and FIG. 17 are measured with the drain-source voltage set at 1 V.

As described above, by setting the hydrogen concentration in the channel layer 7 in a range from $1 \times 10^{16}$ atoms/cm$^3$ to $3 \times 10^{20}$ atoms/cm$^3$, the TFT threshold voltage can be a practical voltage.

Also, since the hydrogen concentration in the lower-layer gate insulating film 61 of the TFT substrate 200 of the present embodiment is equal to or less than $3 \times 10^{21}$ atoms/cm$^3$, hydrogen diffusion is inhibited at a time of use of the TFT substrate 200, and good reliability about the TFT operation is obtained. Grounds for this will be described with reference to FIG. 18 to FIG. 21 illustrating reliability evaluation results of the TFT.

Figure 18:
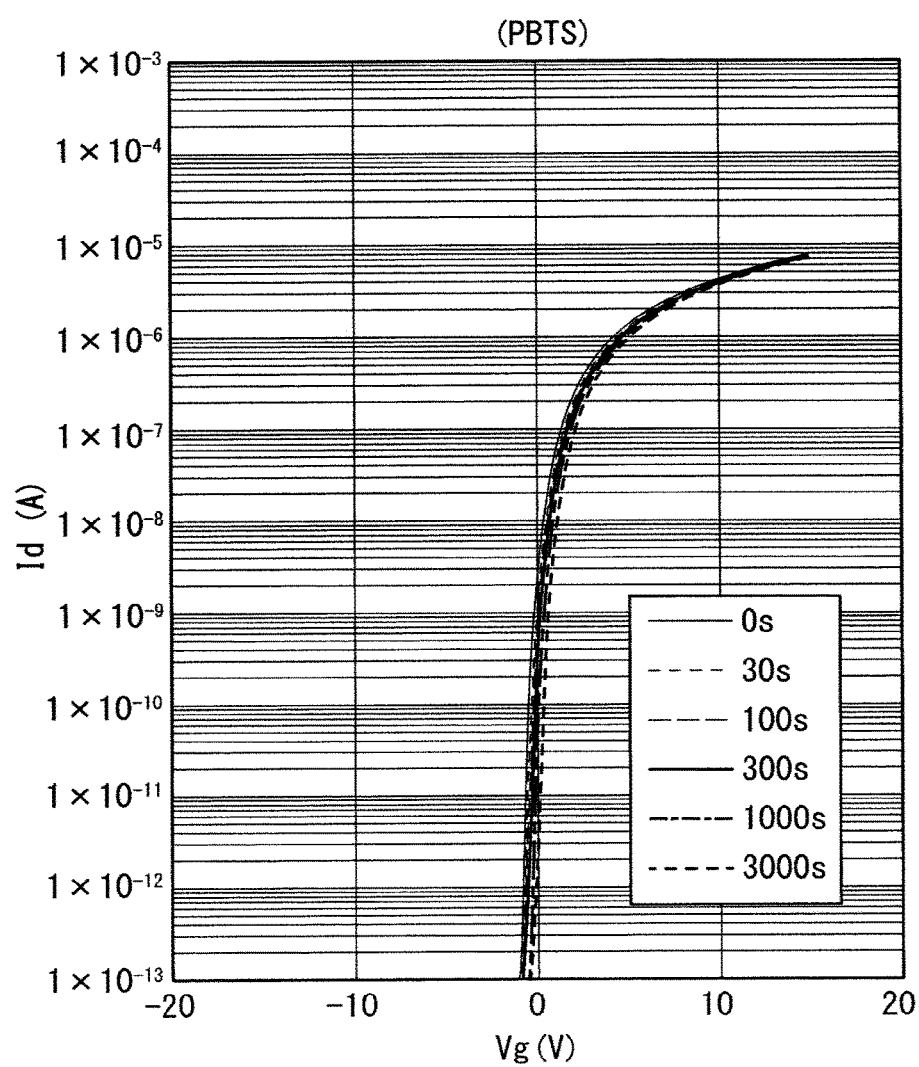
FIG. 18 is a diagram illustrating a reliability evaluation result of the TFT.

FIG. 18 illustrates the Id-Vg characteristic after a PBTS (Positive Bias Temperature Stress) test is performed to continuously apply a gate voltage of +30 V for a predetermined time period at room temperatures to a TFT substrate in which the hydrogen concentration in the lower-layer gate insulating film 61 detected by SIMS satisfies equal to or less than $3 \times 10^{21}$ atoms/cm$^3$. Here, the Id-Vg characteristics are illustrated in a case where +30 V is not applied with the test time of 0 seconds (s), in a case where +30 V is applied for 30 seconds, in a case where +30 V is applied for 100 seconds, in a case where +30 V is applied for 300 seconds, in a case where +30 V is applied for 1000 seconds, and in a case where +30 V is applied for 3000 seconds. As illustrated in FIG. 18, a shift of the threshold voltage is equal to or less than 1 V between the case of 0 seconds and the case of 3000 seconds.

Figure 19:
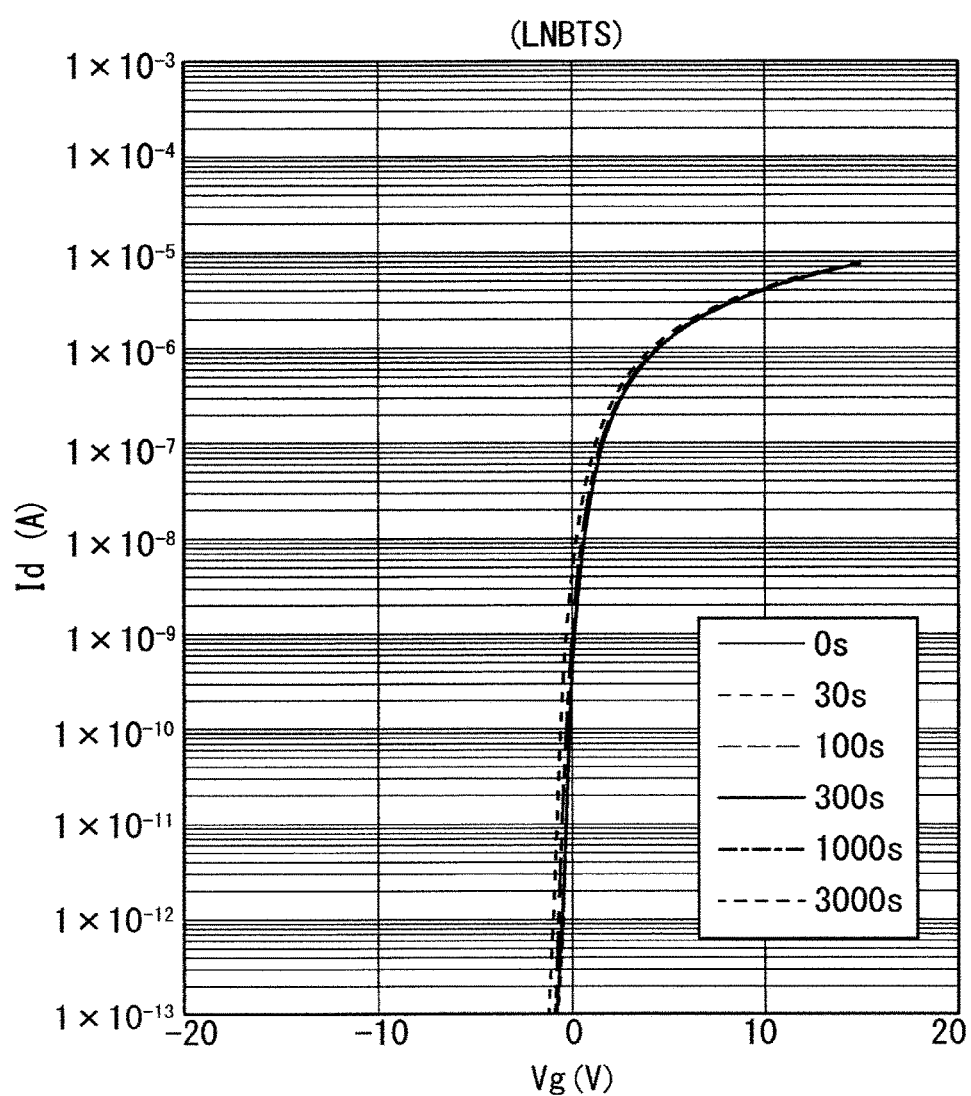
FIG. 19 is a diagram illustrating the reliability evaluation result of the TFT.

Also, FIG. 19 illustrates the Id-Vg characteristic after an LNBTS (Light Negative Bias Temperature Stress) test is performed to continuously apply a gate voltage of −30 V (source-drain voltage is 0 V) for a predetermined time period at room temperatures to a TFT substrate in which a hydrogen concentration in the lower-layer gate insulating film 61 detected by SIMS satisfies equal to or less than $3 \times 10^{21}$ atoms/cm$^3$. The test time is the same as in FIG. 18. As illustrated in FIG. 19, the shift of the threshold voltage is equal to or less than 1 V between the case of 0 seconds and the case of 3000 seconds.

Figure 20:
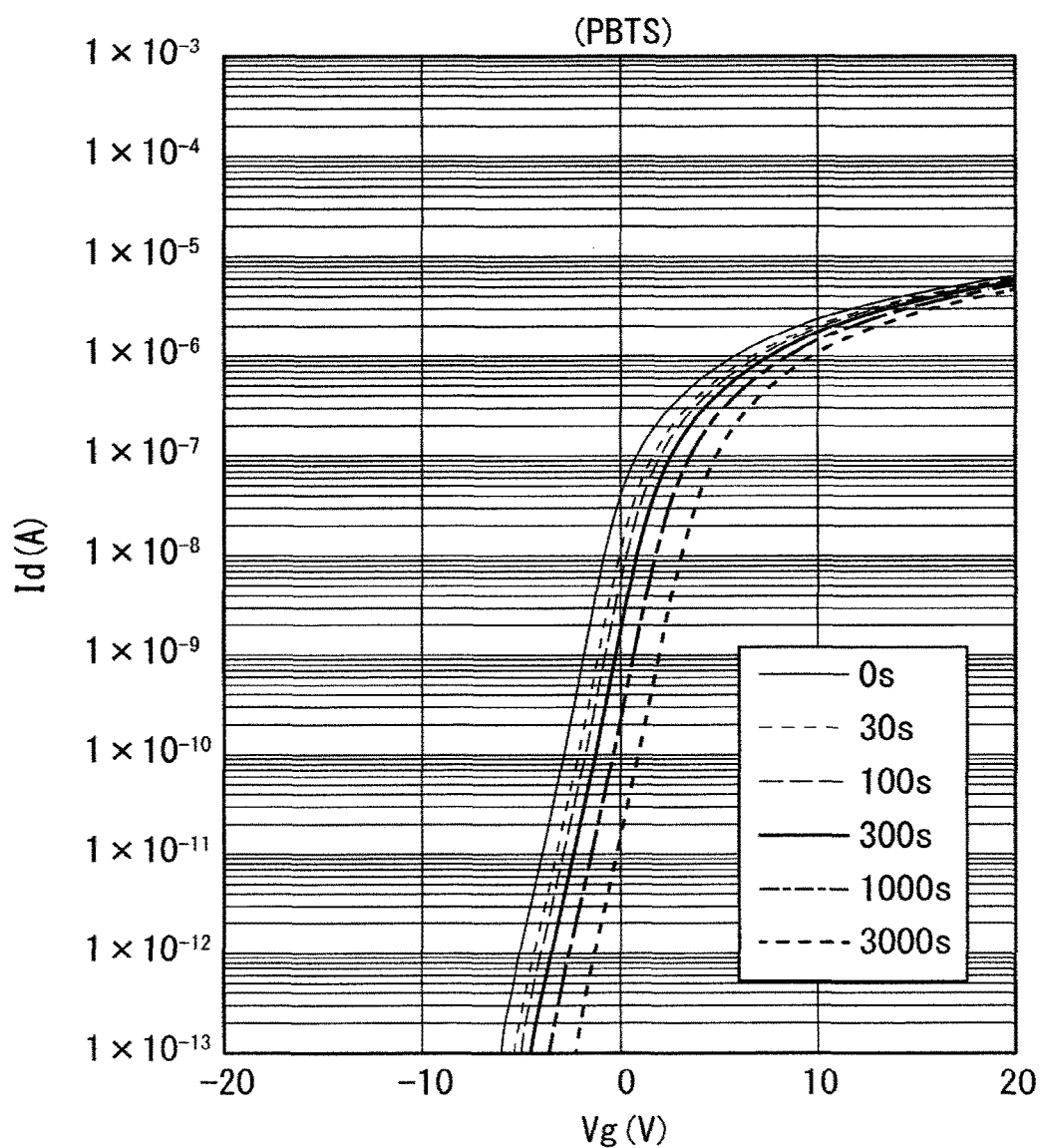
FIG. 20 is a diagram illustrating the reliability evaluation result of the TFT.

Meanwhile, FIG. 20 illustrates the Id-Vg characteristic after the PBTS test is performed under the same condition as in FIG. 18 on a TFT substrate in which the hydrogen concentration in the lower-layer gate insulating film 61 detected by SIMS is $5 \times 10^{21}$ atoms/cm$^3$. As illustrated in FIG. 20, the shift of the threshold voltage is about 3.5 V between the case of 0 seconds and the case of 3000 seconds.

Also, FIG. 21 illustrates the Id-Vg characteristic after the LNBTS test is performed under the same condition as in FIG. 19 on a TFT substrate in which the hydrogen concentration in the lower-layer gate insulating film 61 detected by SIMS is $5 \times 10^{21}$ atoms/cm$^3$. As illustrated in FIG. 21, the shift of the threshold voltage is about 1.5 V between the case of 0 seconds and the case of 3000 seconds.

As described above, it is indicated that by setting the hydrogen concentration in the lower-layer gate insulating film 61 at equal to or less than $3 \times 10^{21}$ atoms/cm$^3$, the shift of the threshold voltage is small both in the PBTS test and in the LNBTS test, and good reliability about the TFT operation is obtained.

As described above, in the TFT substrate 200 of the first embodiment, the hydrogen concentration in the channel layer 7 is equal to or less than $3 \times 10^{20}$ atoms/cm$^3$, and thus the TFT threshold voltage is a practical voltage.

Also, since the hydrogen concentration in the lower-layer gate insulating film 61 is equal to or less than $3 \times 10^{21}$ atoms/cm$^3$, good reliability about the TFT operation is obtained, which is because the gate electrode 3 includes the lamination film obtained by laminating the AlNiNdN film on the AlNiNd film, the AlNiNdN film that is an upper-layer film has hydrogen occlusion capability to contain hydrogen in a range of from $2.5 \times 10^{20}$ atoms/cm$^3$ to $2 \times 10^{22}$ atoms/cm$^3$, and thus the gate electrode 3 takes in and retains hydrogen diffused from the lower-layer gate insulating film 61 on the gate electrode 3 and the further upper-layer channel layer 7 at a time of heat treatment in the manufacturing process. Also, the hydrogen retained in the gate electrode 3 does not move again, and it is inhibited that the hydrogen concentration in the lower-layer gate insulating film 61 and the channel layer 7 rises. Note that in a case where the hydrogen occlusion capability is lower than $2.5 \times 10^{20}$ atoms/cm$^3$, the sufficient hydrogen reduction effect is not achieved. Also, in a case where the hydrogen occlusion capability is higher than $2 \times 10^{22}$ atoms/cm$^3$, a concentration gradient with other layers increases, and thus hydrogen outflow from the gate electrode to many layers will occur.

Also, since hydrogen that diffuses at a time of the TFT operation is also occluded by the gate electrode 3, it is also possible to inhibit that the hydrogen concentration in the channel layer 7 rises at the time of the TFT operation, to inhibit characteristics variation, and to obtain the TFT excellent in reliability.

<Variation>

The TFT substrate 200 of the first embodiment described above includes the back-channel-etch type pixel TFT 201; however, the TFT substrate 200 may have structure that includes an etching stopper type TFT in which an etching stopper layer of a silicon oxide film is provided between a channel layer and an interlayer insulating film.

Figure 22:
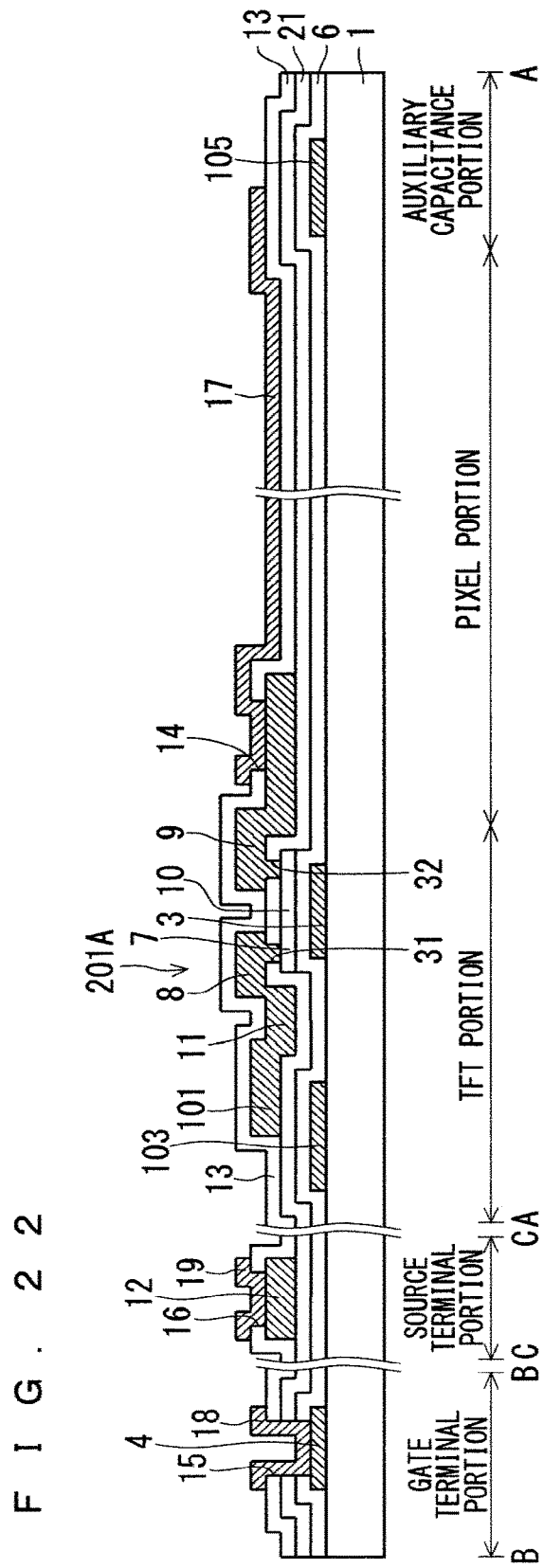
FIG. 22 is a diagram illustrating cross-portion configuration of a variation of the TFT substrate of the first embodiment according to the present invention.

FIG. 22 illustrates cross-portion configuration of a TFT substrate 200 including an etching stopper type pixel TFT 201A. Note that in FIG. 22, the same configuration as in the pixel TFT 201 described with reference to FIG. 3 is denoted with the same symbol, and duplicate description will be omitted.

In the pixel TFT 201A, a protective insulating film 21 including a silicon oxide film with a thickness of 10 to 300 nm is disposed on the gate insulating film 6, the protective insulating film 21 is also disposed on the channel layer 7, and the protective insulating film 21 on the channel layer 7 functions as an etching stopper and protects the channel layer 7 from etching.

In addition, the source electrode 8, the drain electrode 9, the branch wire 11, the source wire 101, and the source terminal 12 are disposed on the protective insulating film 21. The source electrode 8 and the drain electrode 9 are connected to the channel layer 7 through contact holes 31 and 32 that pass through the protective insulating film 21 and reach the channel layer 7, respectively.

In addition, the interlayer insulating film 13 is provided so as to cover the source electrode 8, the drain electrode 9, the branch wire 11, the source wire 101, and the source terminal 12, including on the protective insulating film 21.

The pixel portion has configuration in which the transmissive pixel electrode 17 made of a transparent conductive film is formed on the interlayer insulating film 13, and the transmissive pixel electrode 17 is connected to the drain electrode 9 through the pixel drain contact hole 14 that passes through the interlayer insulating film 13 and reaches the drain electrode 9, Note that at a time of operation of the pixel TFT 201, the channel region 10 is formed within the channel layer 7 between the source electrode 8 and the drain electrode 9, and the protective insulating film 21 covers the channel region 10.

Also, the source terminal portion has structure in which the source terminal pad 19 is connected to the source terminal 12 through the source terminal portion contact hole 16 that passes through the interlayer insulating film 13 and reaches the source terminal 12.

Also, the gate terminal portion has configuration in which the gate terminal pad 18 is connected to the gate terminal 4 through the gate terminal portion contact hole 15 that passes through the interlayer insulating film 13, the protective insulating film 21, and the gate insulating film 6 and reaches the gate terminal 4.

Thus, since the channel region 10 is covered with the protective insulating film 21 in the pixel TFT 201A, the channel region 10 can be protected from etching at the time of forming the source electrode 8 and the drain electrode 9.

Note that the protective insulating film 21 can be obtained, for example, by forming the SiO film with a thickness of 100 nm under an about 200° C. substrate-heating condition, using a mixed gas of SiH$_4$ and N$_2$O, and under a condition that a ratio of N$_2$O to SiH$_4$ is 75 (N$_2$O/SiH$_4$=75).

Note that in a case of forming the protective insulating film 21, a photolithographic process is needed in order to form the contact holes 31 and 32 that connect the source electrode 8 and the drain electrode 9 to the channel layer 7, respectively, leading to increase of one photolithographic process as compared with a case where the back-channel-etch type pixel TFT 201 is used.

Also, FIG. 22 illustrates structure in which the protective insulating film 21 covers an entire surface of the substrate 1, but structure in which the protective insulating film 21 is formed to remain within a range of a region of the channel layer 7 in plan view on the channel layer 7 may be used. In this case, one photolithographic process increases similarly.

Second Embodiment

<Configuration of Overall of TFT Substrate>

Figure 23:
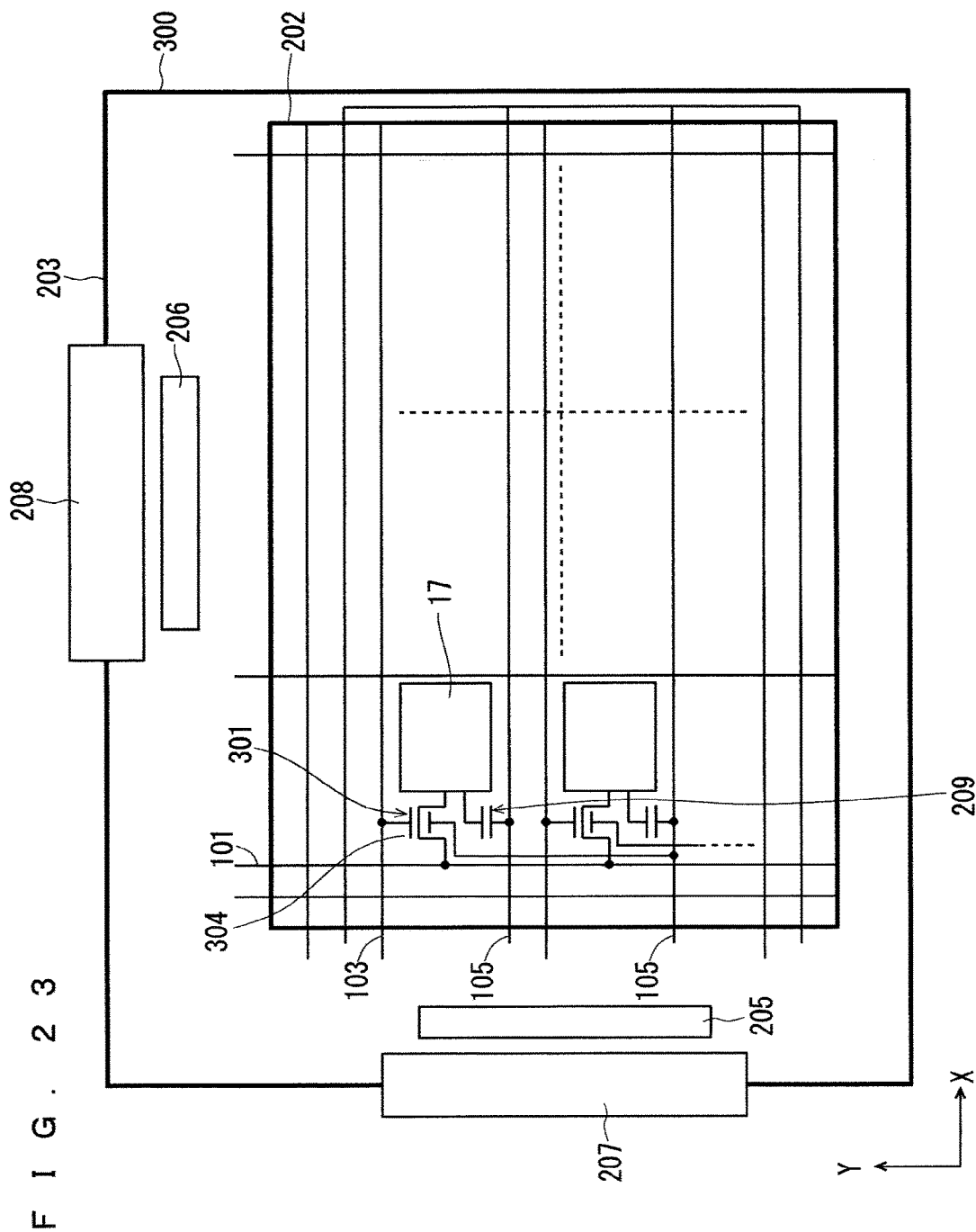
FIG. 23 is a plan view that schematically describes configuration of overall structure of a TFT substrate of a second embodiment according to the present invention.

FIG. 23 is a plan view that schematically describes configuration of overall of a TFT substrate of a second embodiment according to the present invention, and note that the same configuration as in the TFT substrate described with reference to FIG. 1 is denoted with the same symbol, and duplicate description will be omitted.

A TFT substrate 300 illustrated in FIG. 23 is a TFT array substrate on which pixel TFTs 301 are arranged in a matrix.

In FIG. 23, part of pixels 304 is illustrated with configuration thereof enlarged, and at least one pixel TFT 301 is disposed within the pixel 304. The pixel TFT 301 is disposed near an interportion of a source wire 101 and a gate wire 103, a gate electrode of the pixel TFT 301 is connected to the gate wire 103, a source electrode of a pixel TFT 301 is connected to the source wire 101, and a drain electrode of the pixel TFT 301 is connected to a transmissive pixel electrode 17.

In addition, auxiliary capacitance 209 is connected to the transmissive pixel electrode 17, and an auxiliary capacitance wire 105 provided in parallel with each of the plurality of gate wires 103 also serves as an auxiliary capacitance electrode.

The gate wires 103 and the auxiliary capacitance wires 105 are arranged alternately, and the auxiliary capacitance wires 105 and the source wires 101 are arranged so as to intersect each other at right angles.

The pixel TFT 301 is a so-called dual-gate type thin film transistor and has a control electrode other than the gate electrode, and the control electrode is connected to the auxiliary capacitance wire 105.

<Configuration of Pixel on TFT Substrate>

Figure 24:
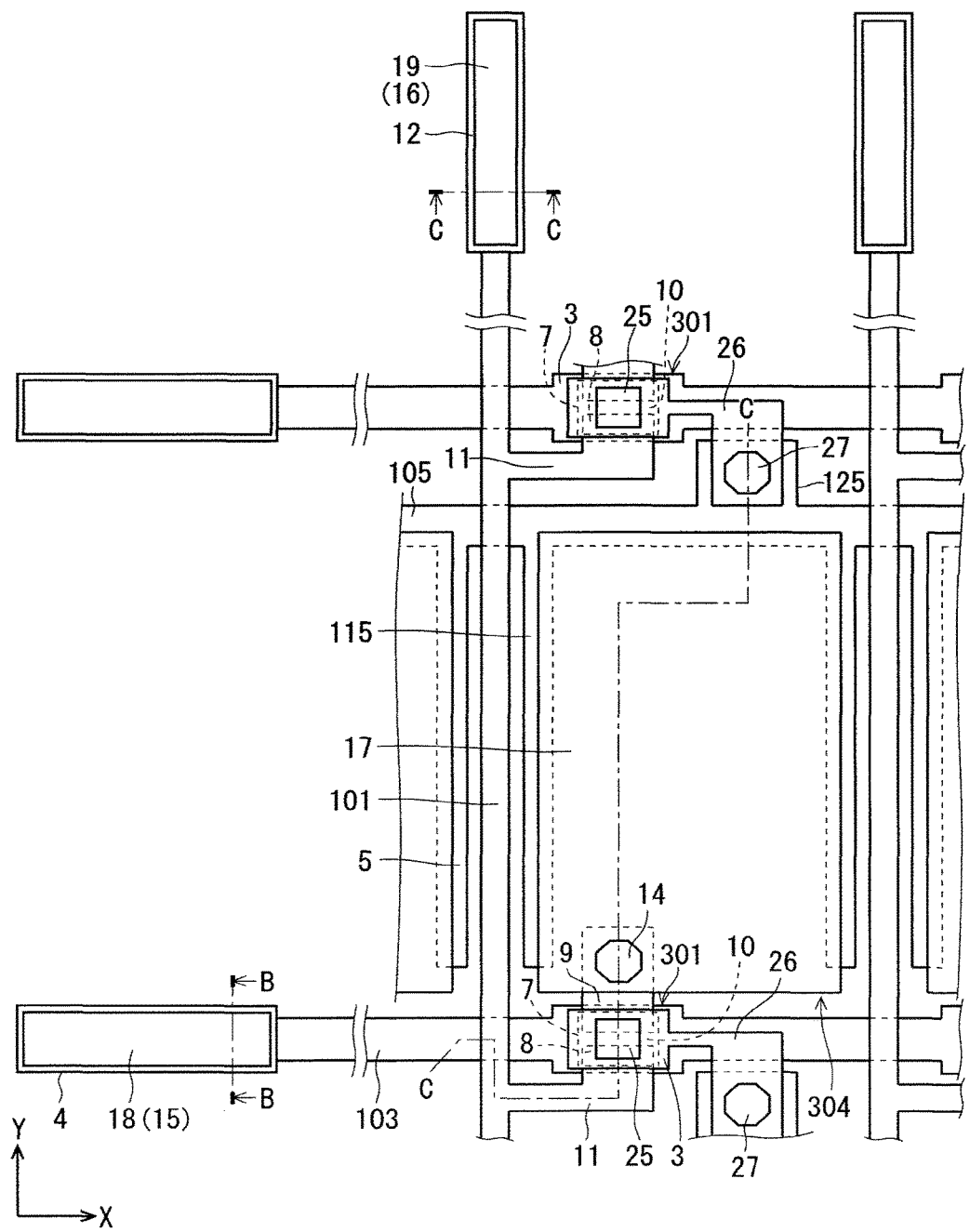
FIG. 24 is a view illustrating planar structure of a pixel of the TFT substrate of the second embodiment according to the present invention.
Figure 25:
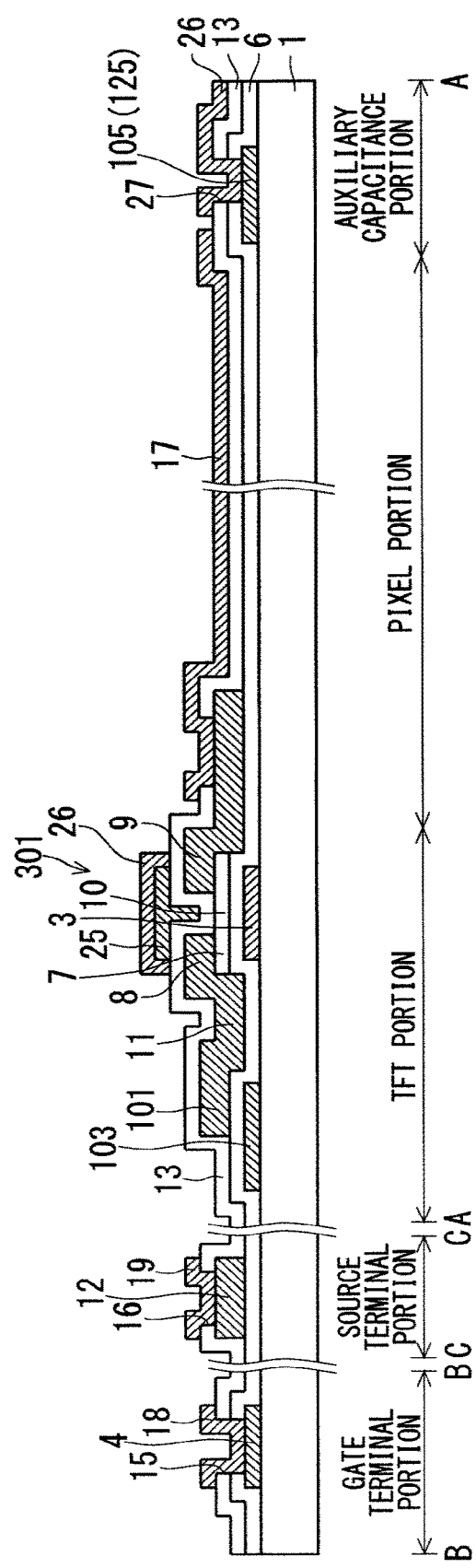
FIG. 25 is a view illustrating cross-portion structure of the pixel of the TFT substrate of the second embodiment according to the present invention.

Next, with reference to FIG. 24 and FIG. 25, configuration of the TFT substrate of the second embodiment according to the present invention, more specifically, the dual-gate type thin film transistor substrate will be described. Note that although the present invention relates to a TFT substrate, the present invention in particular has a characteristic in configuration of pixel, and thus configuration of pixel will be described below. FIG. 24 is a plan view illustrating planar configuration of the pixel 304 illustrated in FIG. 23, whereas FIG. 25 is a cross-portion view illustrating cross-portion configuration taken along the line A-A in FIG. 24 (cross-portion configuration of a TFT portion, a pixel portion, and an auxiliary capacitance portion), cross-portion configuration taken along the line B-B (cross-portion configuration of a gate terminal portion), and cross-portion configuration taken along the line C-C (cross-portion configuration of a source terminal portion). Note that the same configuration as in the pixel 204 described with reference to FIG. 2 and FIG. 3 is denoted with the same symbol, and duplicate description will be omitted.

As illustrated in FIG. 24, a channel layer 7 made of an oxide semiconductor is provided on a gate electrode 3, and a source electrode 8 and a drain electrode 9 are spaced from each other and connected to the channel layer 7. In addition, a control electrode 25 with a size that does not extend from above the channel layer 7 in plan view is provided above the channel layer 7. The control electrode 25 is covered with a transparent wire 26 including a transparent conductive film, and the transparent wire 26 is electrically connected to the auxiliary capacitance wire 105 of another pixel adjacent to the pixel 304 in a Y direction through an auxiliary capacitance electrode contact hole 27.

In a pixel region, the auxiliary capacitance wire 105 has two branch wires 115 extending in the Y direction. The branch wires 115 are provided in a portion corresponding to two peripheral portions on a source wire 101 side of the pixel region, and are arranged such that the auxiliary capacitance wire 105 and the branch wires 115 form a square U-shape in plan view. In addition, a connection pad 125 extending in an opposite direction of an extending direction of the two branch wires 115 is provided on the auxiliary capacitance wire 105. The connection pad 125 is provided so as to be positioned near the gate electrode 3 of another pixel adjacent to the pixel 304 in the Y direction, and the connection pad 125 has configuration in which the transparent wire 26 that covers the control electrode 25 of another adjacent pixel is connected to the connection pad 125 through the auxiliary capacitance electrode contact hole 27.

The control electrode 25 is one gate electrode of the dual gate, and is referred to as a control electrode for convenience in this application. The dual gate is configuration in which gate electrodes are provided above and below the channel layer in order to control a threshold voltage to a desired value, the gate electrode provided below the channel layer (first gate electrode) is at the same potential as the gate wire, and the gate electrode provided above the channel layer (second gate electrode) is at low potential equal to or lower than source potential. Also, in a case where the first gate electrode and the second gate electrode are at different potential, a TFT electric characteristic such as a threshold voltage, for example, can be controlled. For example, by making potential of the second gate electrode at GND potential (earth potential), an effect of electrostatic shielding is obtained. Also, by electrically connecting the first gate electrode and the second gate electrode to make common potential, a gate voltage can be applied from above and below to the channel layer disposed between the first gate electrode and the second gate electrode.

Note that although application to the dual-gate type thin film transistor is illustrated as one application example of the present invention, the control electrode 25 is a metal film that occludes hydrogen, such as an Al alloy or a Ti alloy, in a similar manner to the gate electrode 3, and a film that can contain hydrogen in a range of from $2.5 \times 10^{20}$ atoms/cm$^3$ to $2 \times 10^{22}$ atoms/cm$^3$ contributes to further reduction in the hydrogen concentration of the overall TFT substrate.

Next, cross-portion structure of the pixel 304 will be described with reference to FIG. 25. As illustrated in the TFT portion of FIG. 25, in a formation region of the pixel TFT 301, the channel layer 7 is provided so as to face the gate electrode 3 via a gate insulating film 6, the source electrode 8 and the drain electrode 9 made of conductive films are spaced on the channel layer 7, and at a time of operation of the pixel TFT 301, a channel region 10 is formed within the channel layer 7 between the source electrode 8 and the drain electrode 9.

Also, the source electrode 8, the drain electrode 9, the branch wire 11, and the source wire 101 of the TFT portion, and a source terminal 12 of the source terminal portion are covered with an interlayer insulating film 13, and in the pixel portion, the transmissive pixel electrode 17 made of a transparent conductive film is formed on the interlayer insulating film 13, and in the TFT portion, the control electrode 25 with a size that does not extend from above the channel layer 7 is formed on the interlayer insulating film 13. In addition, the transparent wire 26 made of the same transparent conductive film as the transmissive pixel electrode 17 is provided so as to cover the control electrode 25.

Also, the auxiliary capacitance portion has structure in which the transparent wire 26 is connected to the connection pad 125 through the auxiliary capacitance electrode contact hole 27 that passes through the interlayer insulating film 13 and the gate insulating film 6 and reaches the connection pad 125.

<Manufacturing Method>

Next, a manufacturing method of the TFT substrate of the second embodiment according to the present invention will be described with reference to FIG. 26 to FIG. 30, which are cross-portion views illustrating a manufacturing process sequentially. Note that FIG. 26 to FIG. 30 are cross-portion views corresponding to the cross-portion view illustrated in FIG. 25, and FIG. 25 corresponds to the cross-portion view illustrating a final process. In addition, FIG. 31 is a flowchart illustrating a procedure of the manufacturing method of the TFT substrate of the second embodiment of the present invention, and hereinafter, while referring to FIG. 26 to FIG. 30, description will be made along the flowchart illustrated in step S2001 to step S2011 of FIG. 31. Note that duplicate descriptions of the manufacturing method of the TFT substrate of the first embodiment described with reference to FIG. 4 to FIG. 8 will be omitted.

Figure 26:
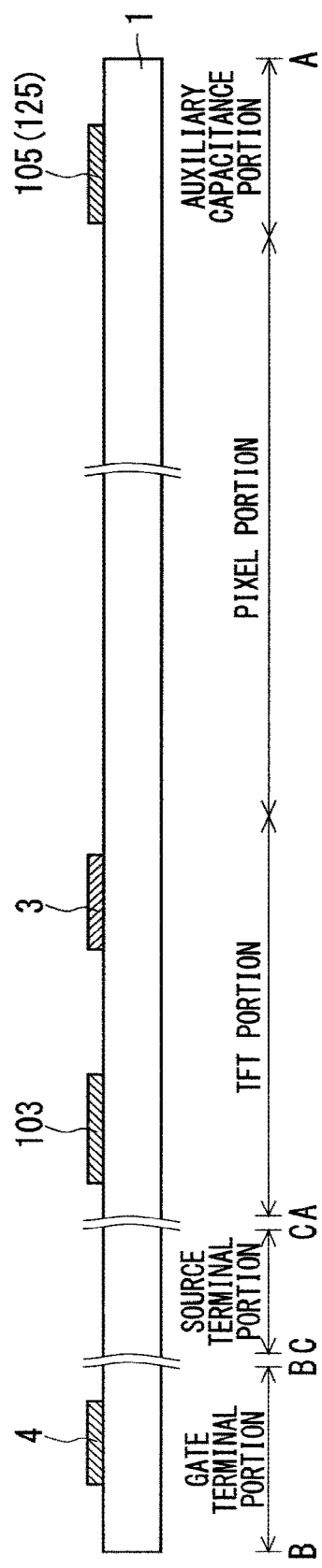
FIG. 26 is a cross-portion view illustrating the manufacturing process of the 41-T substrate of the second embodiment according to the present invention.

To begin with, after a substrate 1, which is a transparent insulating substrate such as glass, is cleaned using cleaning fluid or pure water and a metal film that occludes hydrogen such as an Al alloy or a Ti alloy is formed on the substrate 1, by patterning the metal film through a first photolithographic process, as illustrated in FIG. 26, the gate electrode 3, a gate terminal 4, the gate wire 103, and the auxiliary capacitance wire 105 (including the connection pad 125) are formed on the substrate 1 (step S2001).

As the metal film that occludes hydrogen, it is preferable to use a metal with low electric specific resistance and an alloy such as an Al alloy or a Ti alloy. Furthermore, from a viewpoint of electric specific resistance reduction, lamination structure that is obtained by laminating, on an Al alloy that contains Al as a main component with nickel (Ni) or neodymium (Nd) added, an MN alloy obtained by further adding nitrogen (N) to the above alloy is more preferable. Also, a thickness of the metal film that occludes hydrogen is preferably 50 to 300 nm from a viewpoint of uniformity and coverage.

More specifically, a lamination film with a thickness of 250 nm obtained by laminating an AlNiNdN film on an AlNiNd film is formed by a known sputtering method using an Ar gas or a Kr gas. Note that specific examples of formation conditions of the AlNiNd film and the AlNiNdN film are the same as in the first embodiment.

Next, a resist material is applied onto the lamination film, and a photoresist pattern is formed in a photolithographic process.

Subsequently, by using this photoresist pattern as a mask, collectively etching the lamination film of the AlNiNdN film and the AlNiNd film using known PAN, and by eliminating the photoresist pattern, as illustrated in FIG. 26, the gate electrode 3, the gate terminal 4, the gate wire 103, and the auxiliary capacitance wire 105 (including the connection pad 125) are formed on the substrate 1.

The AlNiNdN film formed here is a film that has hydrogen occlusion capability and can take in hydrogen diffused from a further upper-layer film, and the hydrogen occlusion capability can contain hydrogen in a range of from $2.5 \times 10^{20}$ atoms/cm$^3$ to $2 \times 10^{22}$ atoms/cm$^3$. Note that in order to form the AlNiNdN film having such hydrogen occlusion capability, it is preferable to set a process temperature (substrate temperature) at about 100° C.

Figure 27:
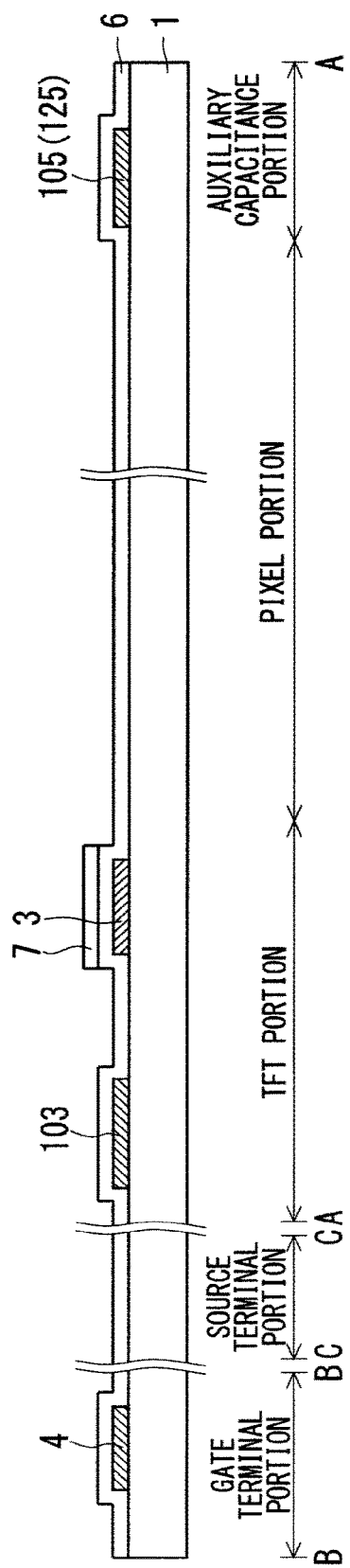
FIG. 27 is a cross-portion view illustrating the manufacturing process of the TFT substrate of the second embodiment according to the present invention.

Next, in the process illustrated in FIG. 27, the gate insulating film 6 is formed on the substrate 1, and the gate insulating film 6 covers the gate electrode 3, the gate terminal 4, the gate wire 103, and the auxiliary capacitance wire 105 (step S2002). The gate insulating film 6 includes a lamination film obtained by laminating an SiO film on an SiN film. A thickness of the overall gate insulating film 6, which varies depending on a dielectric constant of a material that constitutes the lamination film and an operating voltage of the thin film transistor (on-state voltage), is preferably 150 to 500 nm. Specific formation conditions of the gate insulating film 6 are the same as in the first embodiment.

Next, by forming, on the gate insulating film 6, an oxide semiconductor film as a material of the channel layer 7, and patterning the oxide semiconductor film through a second photolithographic process, as illustrated in FIG. 27, the channel layer 7 is formed above the gate electrode 3 of the TFT portion (step S2003). Note that a film thickness of the channel layer 7 is preferably 10 to 100 nm from a viewpoint of film uniformity and carrier density. Specific formation conditions of the channel layer 7 are the same as in the first embodiment.

After formation of the channel layer 7, the first heat treatment is performed under an atmosphere containing oxygen of an oxygen concentration equal to or higher than an atmospheric oxygen concentration (step S2004). Conditions of the first heat treatment are the same as in the first embodiment.

Figure 28:
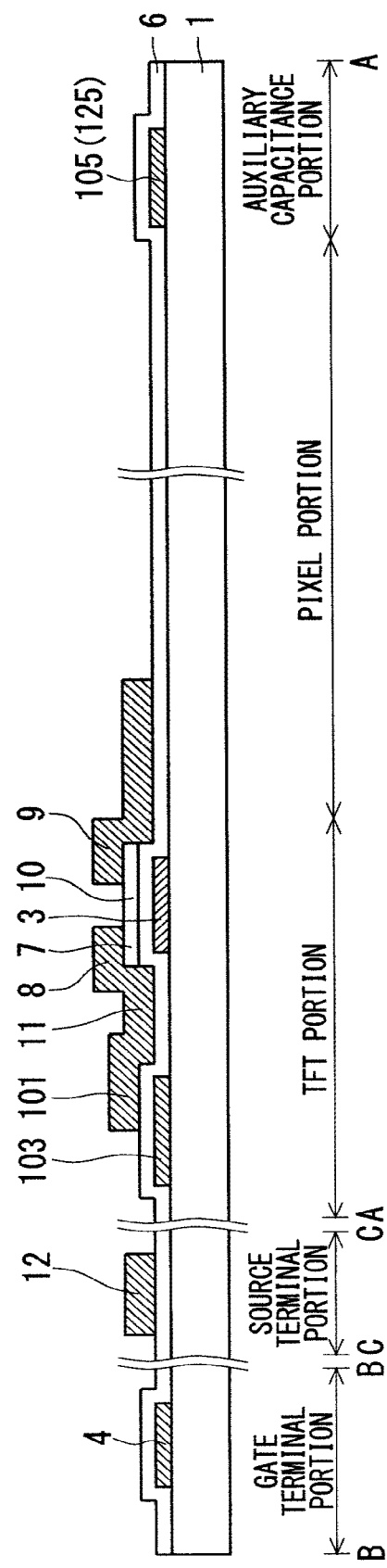
FIG. 28 is a cross-portion view illustrating the manufacturing process of the TFT substrate of the second embodiment according to the present invention.

Next, by forming a metal film on the gate insulating film 6 including on the channel layer 7 and patterning the metal film through a third photolithographic process, as illustrated in FIG. 28, the source electrode 8, the drain electrode 9, the branch wire 11, the source wire 101, and the source terminal 12 are formed (step S2005).

As the metal film to be formed in this process, it is preferable to use an alloy film having characteristics such as low electric specific resistance, indicating good contact characteristics with the channel layer 7, and good contact characteristics with the conductive film used for the transmissive pixel electrode 17 (in particular, low electric contact resistance). Note that a film thickness of the metal film is preferably 50 to 300 nm from a viewpoint of film uniformity and coverage.

More specifically, a lamination film with a thickness of 250 nm obtained by laminating the AlNiNd film on the AlNiNdN film is formed by a known sputtering method using an Ar gas or a Kr gas. Note that specific examples of formation conditions of the AlNiNd film and the AlNiNdN film are the same as in the first embodiment. Note that this AlNiNdN film may also be provided with hydrogen occlusion capability.

After formation of the metal film, second heat treatment is performed under an atmosphere containing oxygen of an oxygen concentration equal to or higher than an atmospheric oxygen concentration (step S2006). Conditions of the second heat treatment are the same as in the first embodiment.

Figure 29:
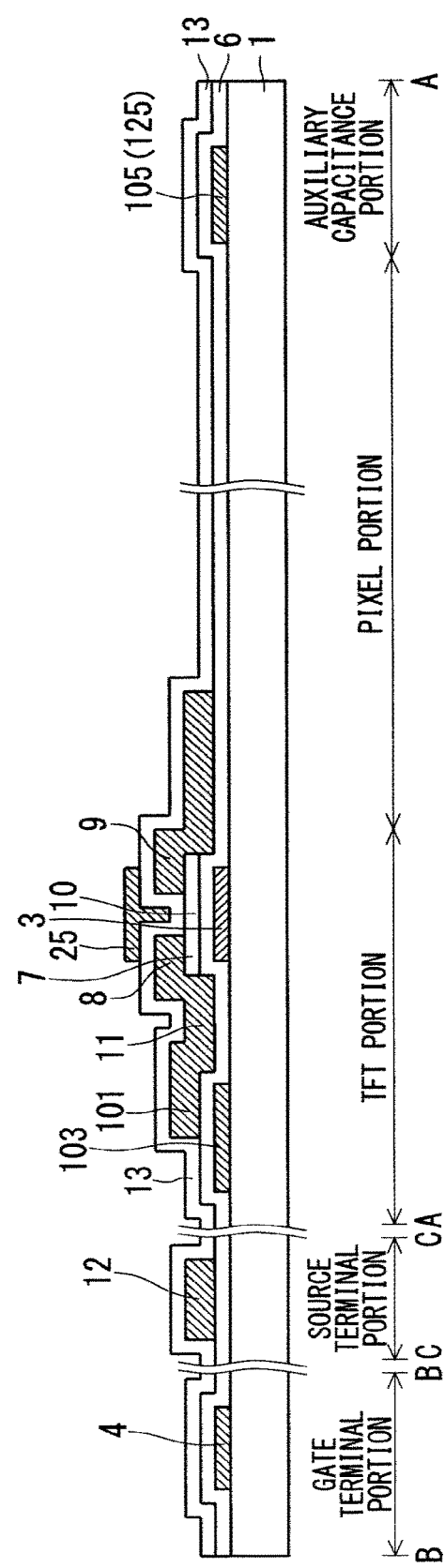
FIG. 29 is a cross-portion view illustrating the manufacturing process of the TFT substrate of the second embodiment according to the present invention.

Next, in the process illustrated in FIG. 29, the interlayer insulating film 13 as a passivation film is formed so as to cover the source electrode 8, the drain electrode 9, the branch wire 11, the source wire 101, and the source terminal 12 (step S2007).

The interlayer insulating film 13 includes a lamination film of a lower-layer film and an upper-layer film, and after the lower-layer film is formed, third heat treatment is performed (step S2008). This heat treatment is performed with objects of reducing surplus hydrogen in the oxide semiconductor and supplying oxygen to each layer from an atmosphere and the lower-layer film. Conditions of the third heat treatment are the same as in the first embodiment.

After the heat treatment, the upper-layer film is formed. Here, a thickness of the overall interlayer insulating film 13, which varies depending on a dielectric constant of a material that constitutes the lamination film and an operating voltage of the thin film transistor (on-state voltage), is preferably 150 to 500 nm. Specific examples of formation conditions of the lower-layer film and the upper-layer film are the same as in the first embodiment.

Subsequently, after a metal film that occludes hydrogen such as an Al alloy or a Ti alloy is formed on the interlayer insulating film 13, by patterning the metal film through a fourth photolithographic process, as illustrated in FIG. 29, the control electrode 25 with a size that does not extend from above the channel layer 7 is formed on the interlayer insulating film 13 (step S2009).

As the metal film that occludes hydrogen, it is preferable to use a metal with low electric specific resistance and an alloy such as an Al alloy or a Ti alloy. Furthermore, from a viewpoint of electric specific resistance reduction, lamination structure obtained by laminating, on an alloy that contains Al as a main component with Ni, Nd, and N added, an alloy that contains Al as a main component with Ni and Nd added is more preferable. Also, a thickness of the metal film that occludes hydrogen is preferably 50 to 300 nm from a viewpoint of uniformity and coverage.

More specifically, a lamination film obtained by laminating the AlNiNd film on the AlNiNdN film is formed by a known sputtering method using an Ar gas or a Kr gas.

A sputtering condition is a DC magnetron sputtering method, an AlNiNd alloy target is used, and the AlNiNdN film with a thickness of about 50 nm is formed as an upper-layer film under conditions of power density of 3 W/cm$^2$, Ar gas flow quantity of 40 sccm, and N$_2$ gas flow quantity of 20 sccm, next, the same target material is used, the AlNiNd film with a thickness of about 200 nm is formed as an upper-layer film under conditions of power density of 3 W/cm$^2$ and Ar gas flow quantity of 40 sccm, and then a lamination film with a thickness of 250 nm is obtained.

The AlNiNdN film formed here is a film that has hydrogen occlusion capability and can take in hydrogen diffused from a lower-layer film, and the hydrogen occlusion capability can contain hydrogen in a range of from $2.5 \times 10^{20}$ atoms/cm$^3$ to $2 \times 10^{22}$ atoms/cm$^3$. Note that in order to form the AlNiNdN film having such hydrogen occlusion capability, it is preferable to set a process temperature (substrate temperature) at about 100° C.

Next, a resist material is applied onto the lamination film, and a photoresist pattern is obtained in the fourth photolithographic process. Subsequently, by using this photoresist pattern as a mask, collectively etching the lamination film of the AlNiNdN film and the AlNiNd film using a known medical fluid containing phosphoric acid, for example PAN, and eliminating the photoresist pattern, the control electrode 25 illustrated in FIG. 29 is obtained.

Figure 30:
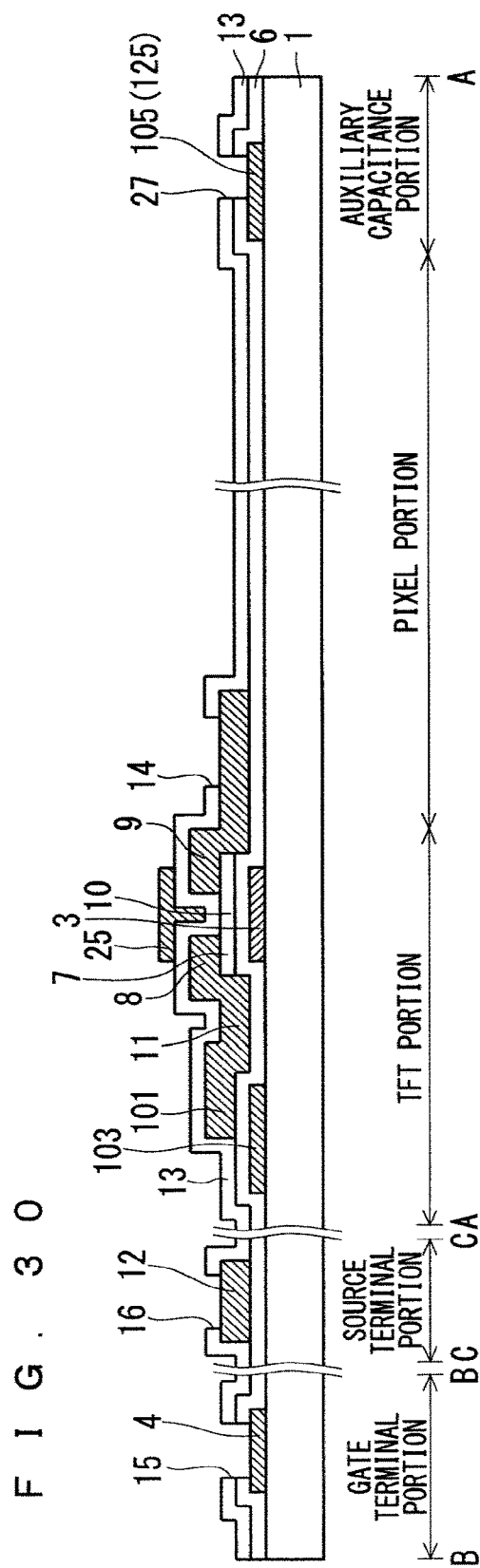
FIG. 30 is a cross-portion view illustrating the manufacturing process of the TFT substrate of the second embodiment according to the present invention.
Figure 31:
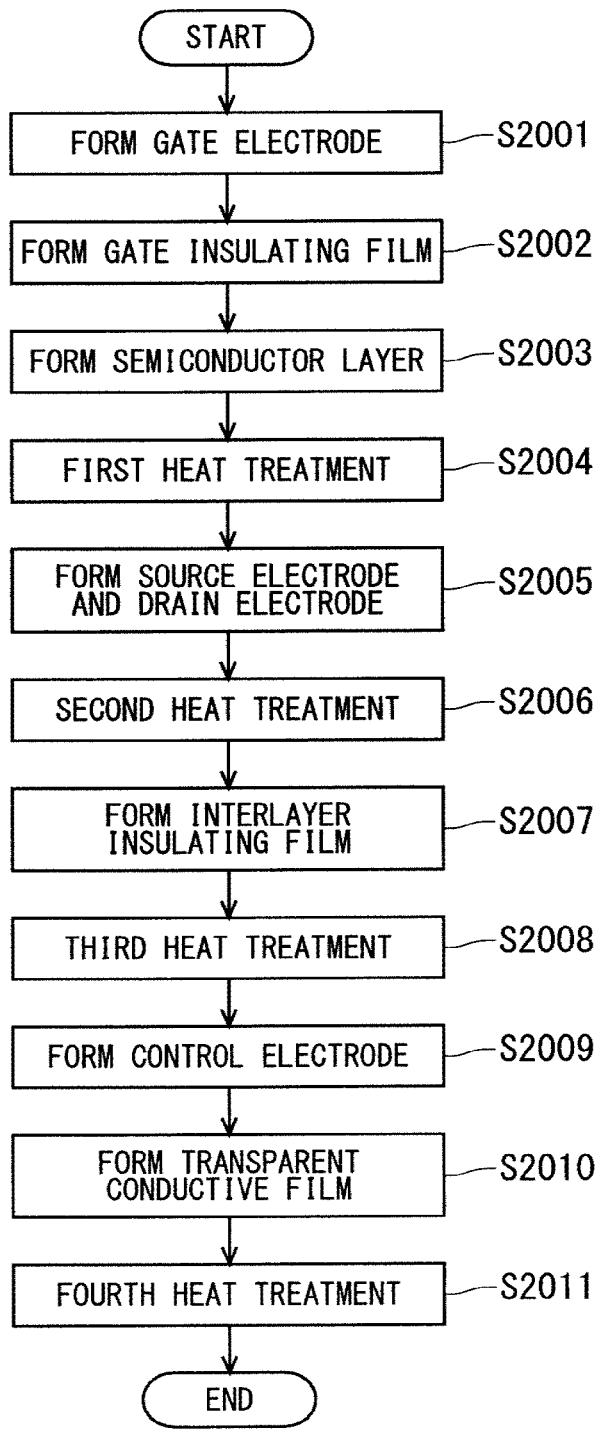
FIG. 31 is a flowchart illustrating a manufacturing process of the TFT substrate of the second embodiment according to the present invention.

Next, in the process illustrated in FIG. 30, a resist material is applied onto the interlayer insulating film 13, and a photoresist pattern is formed in a fifth photolithographic process. Then, by known dry etching using a fluorine-based gas with the photoresist pattern as a mask, a pixel drain contact hole 14 that reaches at least a surface of the drain electrode 9, a gate terminal portion contact hole 15 that reaches a surface of the gate terminal 4, a source terminal portion contact hole 16 that reaches a surface of the source terminal 12, and the auxiliary capacitance electrode contact hole 27 that reaches a surface of the connection pad 125 are formed simultaneously.

Subsequently, by eliminating the photoresist pattern, as illustrated in FIG. 30, the pixel drain contact hole 14, the gate terminal portion contact hole 15, the source terminal portion contact hole 16, and the auxiliary capacitance electrode contact hole 27 are obtained.

Next, by forming a transparent conductive film on the interlayer insulating film 13 including on the control electrode 25, embedding the transparent conductive film within the pixel drain contact hole 14, the gate terminal portion contact hole 15, the source terminal portion contact hole 16, and the auxiliary capacitance electrode contact hole 27, and patterning the transparent conductive film through a sixth photolithographic process, as illustrated in FIG. 25, by forming the transmissive pixel electrode 17 connected to the lower-layer drain electrode 9 through the pixel drain contact hole 14, a gate terminal pad 18 and a source terminal pad 19 connected to the gate terminal 4 and the source terminal 12 through the gate terminal portion contact hole 15 and the source terminal portion contact hole 16, respectively, and the transparent wire 26 connected to the lower-layer connection pad 125 through the auxiliary capacitance electrode contact hole 27, the TFT substrate 300 is completed (step S2010). Note that specific formation conditions of the transparent conductive film are the same as in the first embodiment.

Also, as in the first embodiment, fourth heat treatment is applied to the completed TFT substrate 300 at a temperature of from 200 to 350° C. and under an atmosphere containing oxygen of an oxygen concentration equal to or higher than an atmospheric oxygen concentration (step S2011). With this, by causing hydrogen in the overall TFT substrate to diffuse and to be occluded by the gate electrode 3 and the control electrode 25 or to be discharged outside the substrate, the hydrogen concentration in the overall TFT substrate can be reduced, and TFT characteristics can be improved and stabilized.

Note that by also causing the control electrode 25 to have capability to occlude hydrogen, the amount of occlusion of hydrogen can be increased and further reduction in the hydrogen concentration in the overall TFT substrate can be expected.

Also in the TFT substrate 300 obtained through the above-described process, depth direction distribution analysis of hydrogen using the secondary ion mass spectrometry (SIMS) method is performed on the channel portion of the pixel TFT 301 as in the first embodiment. As a result, it has been confirmed that hydrogen in the interlayer insulating film, the channel layer, and the gate oxide film is reduced by the fourth heat treatment. In addition, after the fourth heat treatment, the hydrogen concentration in the channel layer 7 is equal to or less than $3 \times 10^{20}$ atoms/cm$^3$, and the hydrogen concentration in the lower-layer gate insulating film 61 is $2.3 \times 10^{21}$ atoms/cm$^3$.

This result indicates that the hydrogen concentration conditions necessary for setting the TFT threshold voltage from −10 to 0 V are satisfied, and that the threshold voltage is actually in the range from −10 to 0 V, and that the TFT threshold voltage is a practical voltage. In addition, the hydrogen concentration in the lower-layer gate insulating film 61 is equal to or less than $3 \times 10^{21}$ atoms/cm$^3$, and variations of the threshold both in the PBTS test and in the LNBTS test are equal to or less than 1 V. Therefore, this indicates that good reliability about the TFT operation is obtained.

<Variation>

The TFT substrate 300 of the second embodiment described above has the back-channel-etch type pixel TFT 301; however, the TFT substrate 300 may have structure that includes an etching stopper type TFT in which an etching stopper layer of a silicon oxide film is provided between the channel layer and the interlayer insulating film.

That is, as in the pixel TFT 201A described with reference to FIG. 22, the TFT substrate 200 may have structure in which a protective insulating film including a silicon oxide film with a thickness of from 10 to 300 nm is disposed on the channel layer 7 and is used as an etching stopper layer. Note that formation conditions of the protective insulating film are the same as in the first embodiment.

Although this invention has been described in detail, the above description is illustrative in all aspects, and this invention is not limited thereto. It is understood that countless unillustrated variations can be assumed without departing from the scope of this invention.

Note that in the present invention, embodiments may be arbitrarily combined, or modifications and omissions may be made to the embodiments as appropriate without departing from the scope of the invention.

The invention claimed is:

1. A thin film transistor substrate comprising:
a plurality of pixels arranged in a matrix,
each of the pixels including:
a thin film transistor including:
   a gate electrode made of a metal and disposed on the substrate;
   a gate insulating film covering at least the gate electrode;
   a semiconductor layer including an oxide semiconductor provided at a position facing the gate electrode with the gate insulating film interposed therebetween;
   a source electrode and a drain electrode in contact with the semiconductor layer; and
   an interlayer insulating film provided on at least the semiconductor layer, the source electrode, and the drain electrode; and
a pixel electrode electrically connected to the drain electrode,
wherein the gate electrode has hydrogen occlusion capability of $2.5 \times 10^{20}$ to $2 \times 10^{22}$ atoms/cm$^3$,
the semiconductor layer has a hydrogen concentration of $1 \times 10^{16}$ to $3 \times 10^{20}$ atoms/cm$^3$, and
the gate electrode includes an Al alloy and N.

2. The thin film transistor substrate according to claim 1, wherein the gate electrode includes a lamination film obtained by laminating an AlNiNdN film on an AlNiNd film.

3. The thin film transistor substrate according to claim 1, wherein the oxide semiconductor is a metal oxide containing at least indium, gallium, and zinc.

4. The thin film transistor substrate according to claim 1, wherein
the gate insulating film includes a lamination film obtained by laminating an SiO film on an SiN film, and
a hydrogen concentration in the SiN film is equal to or less than $3 \times 10^{21}$ atoms/cm$^3$.

5. The thin film transistor substrate according to claim 1, wherein
the thin film transistor further includes a protective insulating film covering the semiconductor layer, and
the source electrode and the drain electrode are in contact with the semiconductor layer through contact holes that pass through the protective insulating film.

6. A thin film transistor substrate comprising:
a plurality of pixels arranged in a matrix,
each of the pixels including:
a thin film transistor including:
   a gate electrode made of a metal and disposed on the substrate;
   a gate insulating film covering at least the gate electrode;
   a semiconductor layer including an oxide semiconductor provided at a position facing the gate electrode with the gate insulating film interposed therebetween;
   a source electrode and a drain electrode in contact with the semiconductor layer; and
   an interlayer insulating film provided on at least the semiconductor layer, the source electrode, and the drain electrode; and
a pixel electrode electrically connected to the drain electrode,
wherein the gate electrode has hydrogen occlusion capability of $2.5 \times 10^{20}$ to $2 \times 10^{22}$ atom s/cm$^3$,
the semiconductor layer has a hydrogen concentration of $1 \times 10^{16}$ to $3 \times 10^{20}$ atoms/cm$^3$,
wherein the thin film transistor includes a control electrode made of a metal and provided above the semiconductor layer with the interlayer insulating film interposed therebetween, the control electrode being provided with potential different from the gate electrode or potential common to the gate electrode,
the control electrode has hydrogen occlusion capability of $2.5 \times 10^{20}$ to $2 \times 10^{22}$ atoms/cm$^3$, and
the gate electrode and the control electrode include an Al alloy and N.

7. The thin film transistor substrate according to claim 6, wherein
the gate electrode includes a lamination film obtained by laminating an AlNiNdN film on an AlNiNd film, and
the control electrode includes a lamination film obtained by laminating an AlNiNd film on an AlNiNdN film.

8. The thin film transistor substrate according to claim 6, wherein the oxide semiconductor is a metal oxide containing at least indium, gallium, and zinc.

9. The thin film transistor substrate according to claim 6, wherein
the gate insulating film includes a lamination film obtained by laminating an SiO film on an SiN film, and
a hydrogen concentration in the SiN film is equal to or less than $3 \times 10^{21}$ atoms/cm$^3$.

10. The thin film transistor substrate according to claim 6, wherein
the thin film transistor further includes a protective insulating film covering the semiconductor layer, and
the source electrode and the drain electrode are in contact with the semiconductor layer through contact holes that pass through the protective insulating film.

* * * * *